(12) United States Patent
Mitamura et al.

(10) Patent No.: US 9,641,102 B2
(45) Date of Patent: May 2, 2017

(54) SEMICONDUCTOR DEVICE

(71) Applicant: Renesas Electronics Corporation, Tokyo (JP)

(72) Inventors: Kazuhiro Mitamura, Tokyo (JP); Koji Bando, Tokyo (JP); Yukihiro Sato, Tokyo (JP); Takamitsu Kanazawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/941,721

(22) Filed: Nov. 16, 2015

(65) Prior Publication Data

US 2016/0163615 A1    Jun. 9, 2016

(30) Foreign Application Priority Data

Dec. 3, 2014    (JP) .................................. 2014-245136

(51) Int. Cl.
*H02M 7/537*    (2006.01)
*H01L 27/06*    (2006.01)
(Continued)

(52) U.S. Cl.
CPC ........ *H02M 7/537* (2013.01); *H01L 23/3107* (2013.01); *H01L 23/49551* (2013.01); *H01L 23/49555* (2013.01); *H01L 23/49562* (2013.01); *H01L 23/49568* (2013.01); *H01L 23/49575* (2013.01); *H01L 24/49* (2013.01); *H01L 27/0664* (2013.01); *H01L 29/7397* (2013.01); *H01L 29/861* (2013.01); *H02M 7/003* (2013.01); *H01L 24/06* (2013.01); *H01L 24/29* (2013.01); *H01L 24/32* (2013.01); *H01L 24/48* (2013.01); *H01L 24/73* (2013.01); *H01L 2224/0603* (2013.01); *H01L 2224/29101* (2013.01); *H01L 2224/32245* (2013.01); *H01L 2224/48137* (2013.01); *H01L 2224/48247* (2013.01); *H01L 2224/48257* (2013.01); *H01L 2224/49111* (2013.01); *H01L 2224/49171* (2013.01); *H01L 2224/73265* (2013.01); *H01L 2924/0002* (2013.01);
(Continued)

(58) Field of Classification Search
CPC . H01L 23/3114; H01L 23/36; H01L 27/0664; H01L 29/7397; H01L 29/861; H02M 7/537

See application file for complete search history.

(56) References Cited

U.S. PATENT DOCUMENTS 4,864,483 A * 9/1989 Divan ................. H02M 5/4585
                                                                    363/132
5,703,399 A * 12/1997 Majumdar ............ H01L 21/565
                                                                    257/675
(Continued)

*Primary Examiner* — Bac Au
*Assistant Examiner* — Sophia Nguyen
(74) *Attorney, Agent, or Firm* — Mattingly & Malur, PC

(57) ABSTRACT

For example, a semiconductor device has a lead connected to a second portion of a chip mounting part on which a semiconductor chip to be a heat source is mounted and a lead connected to a third portion of the chip mounting part on which the semiconductor chip to be the heat source is mounted. Further, each of the leads has a protruding portion protruding from a sealing member. In this manner, it is possible to enhance a heat dissipation characteristic of the semiconductor device.

18 Claims, 16 Drawing Sheets

(51) Int. Cl.
*H01L 29/739* (2006.01)
*H01L 29/861* (2006.01)
*H01L 23/31* (2006.01)
*H01L 23/495* (2006.01)
*H02M 7/00* (2006.01)
*H02P 27/06* (2006.01)
*H01L 23/00* (2006.01)

(52) U.S. Cl.
CPC ............. *H01L 2924/00014* (2013.01); *H01L 2924/0781* (2013.01); *H01L 2924/13055* (2013.01); *H01L 2924/13091* (2013.01); *H01L 2924/181* (2013.01); *H01L 2924/1815* (2013.01); *H02P 27/06* (2013.01)

(56) References Cited

U.S. PATENT DOCUMENTS

| | | | | |
|---|---|---|---|---|
| 6,291,880 B1* | 9/2001 | Ogawa | H01L 23/4334 | 257/723 |
| 6,313,598 B1* | 11/2001 | Tamba | H01L 23/3107 | 257/692 |
| 6,337,803 B2* | 1/2002 | Kikuchi | | 363/131 |
| 6,525,950 B1* | 2/2003 | Shirakawa | H02M 7/003 | 307/148 |
| 6,528,868 B1* | 3/2003 | Weiblen | H01L 23/49503 | 257/669 |
| 6,603,197 B1* | 8/2003 | Yoshida | H01L 23/49537 | 257/666 |
| 6,794,742 B2* | 9/2004 | Kawafuji | H01L 23/49562 | 257/690 |
| 6,933,593 B2* | 8/2005 | Fissore | H01L 23/49861 | 257/666 |
| 6,979,909 B2* | 12/2005 | Shinohara | H01L 23/4334 | 257/706 |
| 8,649,159 B2* | 2/2014 | Fujita | H01L 25/072 | 310/43 |
| 8,890,310 B2* | 11/2014 | Lee | H01L 23/4334 | 257/666 |
| 9,275,930 B2* | 3/2016 | Mashimo | H01L 21/565 | |
| 2002/0109211 A1* | 8/2002 | Shinohara | H01L 23/4334 | 257/666 |
| 2003/0062601 A1* | 4/2003 | Harnden | H01L 23/3107 | 257/666 |
| 2005/0035434 A1* | 2/2005 | Fissore | H01L 23/49861 | 257/666 |
| 2005/0093123 A1* | 5/2005 | Yoshida | H01L 23/36 | 257/678 |
| 2005/0121777 A1* | 6/2005 | Hata | H01L 23/49562 | 257/713 |
| 2005/0151229 A1* | 7/2005 | Imaizumi | H01L 23/49531 | 257/622 |
| 2006/0043545 A1* | 3/2006 | Yea | H01L 23/49575 | 257/666 |
| 2007/0001273 A1* | 1/2007 | Sato | H01L 23/485 | 257/666 |
| 2007/0052379 A1* | 3/2007 | Suh | H02P 27/08 | 318/400.26 |
| 2007/0132110 A1* | 6/2007 | Fujita | H01L 23/3135 | 257/787 |
| 2008/0012036 A1* | 1/2008 | Loh | H01L 33/483 | 257/99 |
| 2008/0191340 A1* | 8/2008 | Stolze | H01L 25/072 | 257/719 |
| 2009/0129038 A1* | 5/2009 | Takakusaki | H01L 23/49861 | 361/772 |
| 2010/0252918 A1* | 10/2010 | Jiang | H01L 21/4842 | 257/675 |
| 2010/0289127 A1* | 11/2010 | Kanazawa | H01L 21/4842 | 257/666 |
| 2013/0155745 A1* | 6/2013 | Tanaka | H02M 7/003 | 363/131 |
| 2014/0027891 A1* | 1/2014 | Kimura | H01L 23/3107 | 257/675 |
| 2014/0070389 A1* | 3/2014 | Kaneda | H01L 24/09 | 257/676 |
| 2014/0184303 A1* | 7/2014 | Hasegawa | H03K 17/12 | 327/377 |
| 2016/0093594 A1* | 3/2016 | Funatsu | H01L 24/49 | 257/784 |
| 2016/0099189 A1* | 4/2016 | Khai Yen | H01L 23/49541 | 257/676 |
| 2016/0163615 A1* | 6/2016 | Mitamura | H01L 23/36 | 257/140 |

* cited by examiner

SEMICONDUCTOR DEVICE

CROSS-REFERENCE TO RELATED APPLICATION

The present application claims priority from Japanese Patent Application No. 2014-245136 filed on Dec. 3, 2014, the content of which is hereby incorporated by reference into this application.

TECHNICAL FIELD OF THE INVENTION

The present invention relates to a semiconductor device, for example, a technique effectively applied to a semiconductor device to be a component of an inverter.

BACKGROUND OF THE INVENTION

A semiconductor device to be a component of a three-phase inverter is described in the specification of US Patent Application Publication No. 2007/0052379 (Patent Document 1). In this semiconductor device, three semiconductor chips constituting an upper arm of a three-phase inverter and three semiconductor chips constituting a lower arm of the three-phase inverter are alternately arranged along a long side of a sealing member.

SUMMARY OF THE INVENTION

For example, the Patent Document 1 describes a semiconductor device including: a first chip mounting part which has a first portion, a second portion and a third portion; a second chip mounting part which is sandwiched between the first portion and the second portion when seen in a plan view; a third chip mounting part which is sandwiched between the second portion and the third portion when seen in a plan view; and a fourth chip mounting part which sandwiches the third portion between itself and the third chip mounting part in a planar manner.

Further, the semiconductor chips constituting the upper arm of the three-phase inverter are mounted on respective surfaces of the first portion, the second portion and the third portion of the first chip mounting part, and the semiconductor chips constituting the lower arm of the three-phase inverter are mounted on respective surfaces of the second chip mounting part to the fourth chip mounting part.

At this time, a lead connected to the first portion among the first portion, the second portion and the third portion of the first chip mounting part protrudes from the sealing member, while leads connected to each of the second portion and the third portion are not formed. This is because, if a power supply potential is supplied from the lead connected to the first portion of the first chip mounting part, it is possible to supply the power supply potential also to the second portion and the third portion which are integrally formed with the first portion.

However, in this configuration, a dissipation path of heat generated from the semiconductor chips mounted on the surfaces of the second portion and the third portion of the first chip mounting part is limited to a dissipation path from the lead connected to the first portion. In addition, since the second portion of the first chip mounting part is sandwiched between the second chip mounting part and the third chip mounting part and the third portion of the first chip mounting part is sandwiched between the third chip mounting part and the fourth chip mounting part, the heat generated from the second portion and the third portion of the first chip mounting part is likely to be accumulated inside the semiconductor device. This often leads to a situation in which electrical characteristics of the semiconductor device are degraded.

From the foregoing, the technique described in the Patent Document 1 has room for improving the heat dissipation characteristics from the semiconductor chips mounted on the second portion and the third portion of the first chip mounting part. Namely, there is room for improvement from the viewpoint of enhancing the heat dissipation characteristics of the semiconductor device in the technique described in the Patent Document 1.

The other problems and novel characteristics of the present invention will be apparent from the description of the present specification and the accompanying drawings.

A semiconductor device according to an embodiment includes a first chip mounting part which has a first portion and a second portion and a second chip mounting part and a third chip mounting part which sandwich the second portion when seen in a plan view. Further, the semiconductor device according to an embodiment has not only a lead connected to the first portion but also a lead connected to the second portion, and the lead connected to the second portion also protrudes from a sealing member.

According to an embodiment, it is possible to enhance a heat dissipation characteristic of a semiconductor device.

BRIEF DESCRIPTIONS OF THE DRAWINGS

DESCRIPTIONS OF THE PREFERRED EMBODIMENTS

Figure 1:
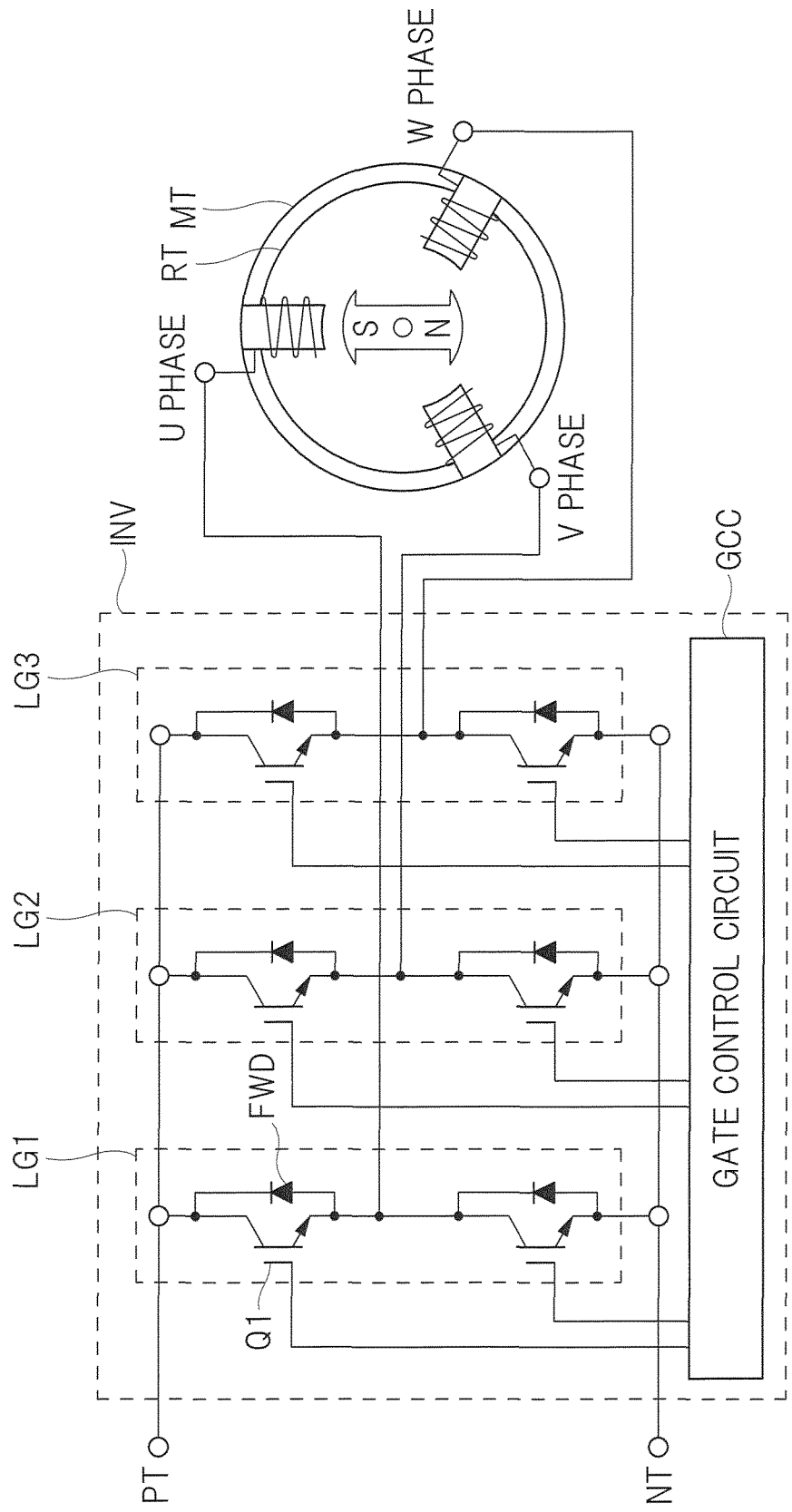
FIG. 1 is a circuit diagram illustrating a configuration of a motor circuit that includes an inverter circuit and a three-phase induction motor in a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters throughout the drawings for describing the embodiments, and the repetitive description thereof is omitted. Note that hatching is sometimes used even in a plan view so as to make the drawings easy to see.

First Embodiment

Configuration Example of Three-Phase Inverter Circuit

A semiconductor device in the first embodiment is used in, for example, a drive circuit of a three-phase induction motor for use in an air conditioner and the like. Specifically, this drive circuit includes an inverter circuit, and the inverter circuit has a function of converting DC power into AC power.

FIG. 1 is a circuit diagram illustrating a configuration of a motor circuit that includes an inverter circuit and a three-phase induction motor in the first embodiment. In FIG. 1, the motor circuit has a three-phase induction motor MT and an inverter circuit INV. The three-phase induction motor MT is configured to be driven by three-phase voltages having different phases. Specifically, the three-phase induction motor MT generates a rotating magnetic field around a rotor RT, which is a conductor, by using three-phase AC called a U-phase, a V-phase and a W-phase whose phases are shifted by 120 degrees. In this case, the magnetic field rotates around the rotor RT. This means that a magnetic flux across the rotor RT that is the conductor changes. As a result, an electromagnetic induction occurs in the rotor RT that is the conductor, and an induced current flows through the rotor RT. Then, the state where the induced current flows in the rotating magnetic field means that a force is applied to the rotor RT by the Fleming's left-hand rule, and the rotor RT is rotated by this force. As described above, it can be understood that the three-phase induction motor MT can rotate the rotor RT by using the three-phase AC. Namely, the three-phase induction motor MT requires the three-phase AC. Thus, in the motor circuit, the three-phase AC is supplied to the three-phase induction motor by using the inverter circuit INV that produces AC from DC.

Hereinafter, a configuration example of the inverter circuit INV will be described. As illustrated in FIG. 1, for example, an IGBT Q1 and a diode FWD are provided so as to correspond to the three phases in the inverter circuit INV in the first embodiment. Namely, in the inverter circuit INV in the first embodiment, a switching element to be a component of the inverter circuit INV is realized by, for example, a configuration in which the IGBT Q1 and the diode FWD are connected in antiparallel as illustrated in FIG. 1. Specifically, in FIG. 1, each of an upper arm and a lower arm of a first leg LG1, an upper arm and a lower arm of a second leg LG2, and an upper arm and a lower arm of a third leg LG3 is configured of the component in which the IGBT Q1 and the diode FWD are connected in antiparallel.

In other words, in the inverter circuit INV in the first embodiment, the IGBT Q1 and the diode FWD are connected in antiparallel between a positive potential terminal PT and each phase (U phase, V phase and W phase) of the three-phase induction motor MT, and the IGBT Q1 and the diode FWD are connected in antiparallel also between each phase of the three-phase induction motor MT and a negative potential terminal NT. Namely, the two IGBTs Q1 and the two diodes FWD are provided for a single phase, and the six IGBTs Q1 and the six diodes FWD are provided for the three phases. Furthermore, a gate control circuit GCC is connected to each gate electrode of the IGBTs Q1, and a switching operation of the IGBT Q1 is controlled by the gate control circuit GCC. In the inverter circuit INV configured in this manner, DC power is converted into three-phase AC power by controlling the switching operation of the IGBT Q1 by the gate control circuit GCC, and this three-phase AC power is supplied to the three-phase induction motor MT.

<Necessity of Diode>

As described above, in the inverter circuit INV in the first embodiment, the IGBT Q1 is used as the switching element, and the diode FWD is provided so as to be connected in antiparallel to the IGBT Q1. Simply, from the viewpoint of realizing the switching function by the switching element, the IGBT Q1 as the switching element is necessary, but it appears that it is unnecessary to provide the diode FWD. In this regard, when an inductance is included in a load connected to the inverter circuit INV, it is necessary to provide the diode FWD. The reasons therefor will be described below.

In the case where the load is a pure resistance that includes no inductance, the diode FWD is unnecessary because there is no reflux energy. However, when a circuit including the inductance such as a motor is connected to the load, there is a mode in which a load current flows in a reverse direction with respect to a switch in an ON state. Namely, when the inductance is included in the load, energy returns from the inductance of the load to the inverter circuit INV in some cases (current may flow back).

At this time, since the IGBT Q1 alone does not have a function to allow the reflux current to flow, it is necessary to connect the diode FWD in antiparallel to the IGBT Q1. Namely, in the inverter circuit INV, in the case where the inductance is included in the load like in a motor control, the energy ($1/2LI^2$) accumulated in the inductance must be released when the IGBT Q1 is turned off. However, the IGBT Q1 alone cannot make the reflux current flow so as to release the energy accumulated in the inductance. Thus, in order to reflux the electrical energy accumulated in the inductance, the diode FWD is connected in antiparallel to the IGBT Q1. In other words, the diode FWD has a function to allow the reflux current to flow so as to release the electrical energy accumulated in the inductance. From the foregoing, it can be understood that it is necessary to provide the diode FWD in antiparallel to the IGBT Q1 serving as the switching element in the inverter circuit connected to the load including the inductance. This diode FWD is referred to as a free wheel diode.

<Structure of IGBT>

A structure of the IGBT Q1 and the diode FWD constituting the inverter circuit INV in the first embodiment will be described with reference to the drawings. The inverter circuit INV in the first embodiment includes the IGBT Q1 and also the diode FWD.

Figure 2:
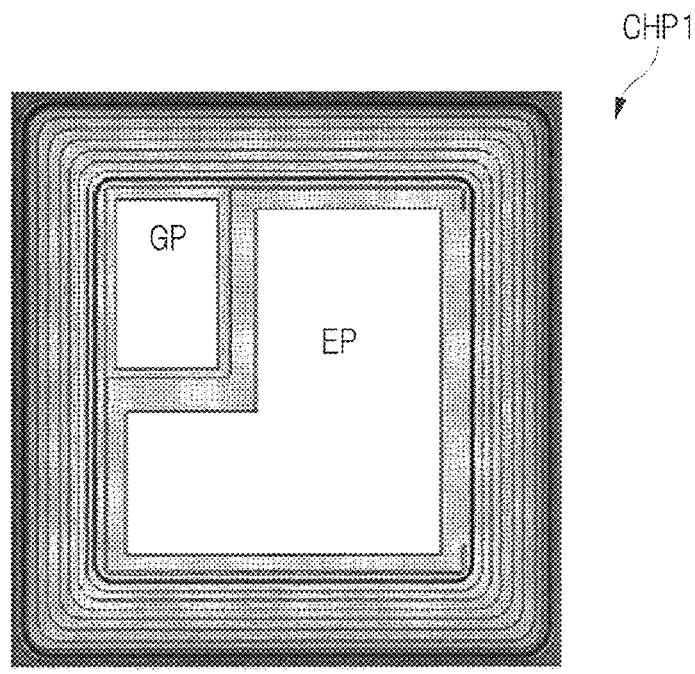
FIG. 2 is a plan view illustrating an outer shape of a semiconductor chip in which an insulated gate bipolar transistor (IGBT) is formed.

FIG. 2 is a plan view illustrating an outer shape of a semiconductor chip CHP1 in which the IGBT Q1 is formed. FIG. 2 illustrates a main surface (front surface) of the semiconductor chip CHP1. As illustrated in FIG. 2, a planar shape of the semiconductor chip CHP1 in the first embodiment is, for example, a square shape. Further, an emitter electrode pad EP and a gate electrode pad GP are formed on a front surface of the semiconductor chip CHP1 having the square shape. Meanwhile, though not illustrated in FIG. 2, a collector electrode pad is formed on a rear surface on the opposite side of the front surface of the semiconductor chip CHP1.

<Device Structure of IGBT>

Figure 3:
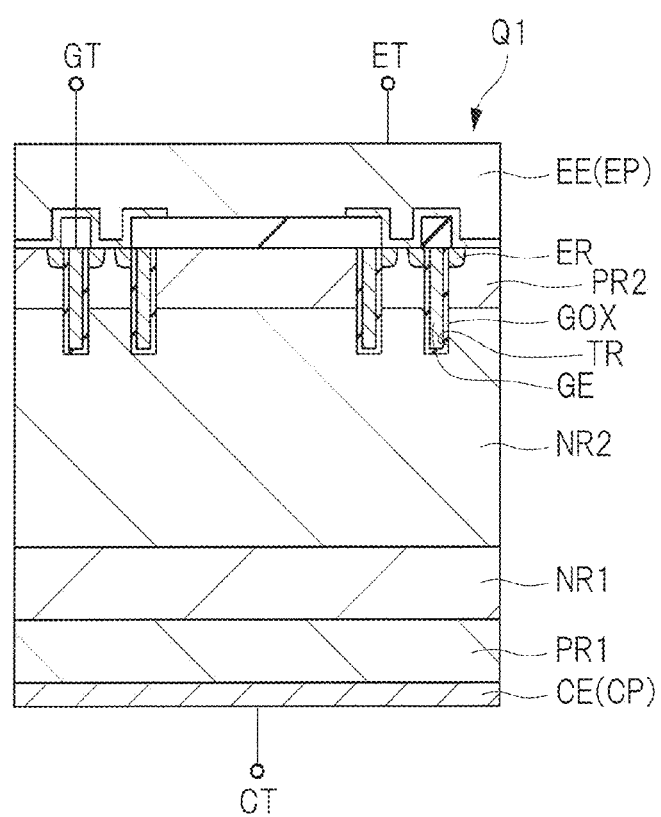
FIG. 3 is a cross-sectional view illustrating a device structure of the IGBT in the first embodiment.

Subsequently, a device structure of the IGBT Q1 will be described. FIG. 3 is a cross-sectional view illustrating the device structure of the IGBT Q1 in the first embodiment. In FIG. 3, the IGBT Q1 has a collector electrode CE (collector electrode pad CP) formed on the rear surface of the semiconductor chip, and a $p^+$ type semiconductor region PR1 is formed on the collector electrode CE. An $n^+$ type semiconductor region NR1 is formed on the $p^+$ type semiconductor region PR1, and an $n^-$ type semiconductor region NR2 is formed on the $n^+$ type semiconductor region NR1. Further, a p type semiconductor region PR2 is formed on the $n^-$ type semiconductor region NR2, and a trench TR that penetrates through the p type semiconductor region PR2 and reaches the $n^-$ type semiconductor region NR2 is formed. Furthermore, an $n^+$ type semiconductor region ER to be an emitter region is formed in alignment with the trench TR. A gate insulating film GOX made of, for example, a silicon oxide film is formed inside the trench TR, and a gate electrode GE is formed in the trench TR with the gate insulating film GOX interposed therebetween. The gate electrode GE is made of, for example, a polysilicon film, and is formed so as to fill the trench TR. In addition, although the trench gate structure is illustrated in FIG. 3, the present invention is not limited thereto. For example, though not illustrated, an IGBT using a planar gate structure formed on a silicon substrate may also be used.

In the IGBT Q1 configured as described above, the gate electrode GE is connected to a gate terminal GT through the gate electrode pad GP illustrated in FIG. 2. Similarly, the $n^+$ type semiconductor region ER to be the emitter region is electrically connected with the emitter terminal ET through an emitter electrode EE (emitter electrode pad EP). The $p^+$ type semiconductor region PR1 to be the collector region is electrically connected with the collector electrode CE formed on the rear surface of the semiconductor chip.

The IGBT Q1 configured as described above has both of the high-speed switching characteristic and the voltage driving characteristic of the power MOSFET (Metal Oxide Semiconductor Field Effect Transistor) and the low on-voltage characteristic of the bipolar transistor.

Note that the $n^+$ type semiconductor region NR1 is referred to as a buffer layer. The $n^+$ type semiconductor region NR1 is provided for preventing a punch-through phenomenon in which a depletion layer growing from the p type semiconductor region PR2 to the $n^-$ type semiconductor region NR2 comes into contact with the $p^+$ type semiconductor region PR1 formed below the $n^-$ type semiconductor region NR2 when the IGBT Q1 is turned off. In addition, the $n^+$ type semiconductor region NR1 is provided for the purpose of limiting the implantation amount of holes from the $p^+$ type semiconductor region PR1 to the $n^-$ type semiconductor region NR2.

<Operation of IGBT>

Next, the operation of the IGBT Q1 in the first embodiment will be described. First, the turn-on operation of the IGBT Q1 will be described. In FIG. 3, the MOSFET having the trench gate structure is turned on by applying a sufficient positive voltage between the gate electrode GE and the $n^+$ type semiconductor region ER to be the emitter region. In this case, a region between the $p^+$ type semiconductor region PR1 constituting the collector region and the $n^-$ type semiconductor region NR2 is forward-biased, and hole implantation occurs from the $p^+$ type semiconductor region PR1 to the $n^-$ type semiconductor region NR2. Subsequently, as many electrons as the positive charges of the implanted holes are collected in the $n^-$ type semiconductor region NR2. In this manner, a resistance of the $n^-$ type semiconductor region NR2 is reduced (conductivity modulation), and the IGBT Q1 becomes an ON state.

A junction voltage of the $p^+$ type semiconductor region PR1 and the $n^-$ type semiconductor region NR2 is added to the on-voltage. However, since the resistance value of the $n^-$ type semiconductor region NR2 is reduced by one order of magnitude or more due to the conductivity modulation, the on-voltage is lower in the IGBT Q1 than in the power MOSFET at a high breakdown voltage occupying most of an on-resistance. Therefore, it can be understood that the IGBT Q1 is a device effective for increasing the breakdown voltage. More specifically, it is necessary to increase a thickness of an epitaxial layer serving as a drift layer so as to achieve the high breakdown voltage in the power MOSFET, but in this case, the on-resistance also increases. On the other hand, in the IGBT Q1, even when the thickness of the $n^-$ type semiconductor region NR2 is increased so as to achieve the high breakdown voltage, the conductivity modulation occurs at the time of the turn-on operation of the IGBT Q1. Therefore, the on-resistance can be more lowered than that of the power MOSFET. In short, in comparison with the power MOSFET, the IGBT Q1 can realize a device having a low on-resistance even when the breakdown voltage is increased.

Subsequently, the turn-off operation of the IGBT Q1 will be described. When a voltage between the gate electrode GE and the $n^+$ type semiconductor region ER to be the emitter region is reduced, the MOSFET having the trench gate structure is turned off. In this case, the hole implantation from the $p^+$ type semiconductor region PR1 to the $n^-$ type semiconductor region NR2 is stopped, and the already implanted holes also reach their end of life and decrease. The remaining holes directly flow out to the emitter electrode EE (tail current), and when the outflow has been completed, the IGBT Q1 becomes an OFF state. In this way, the IGBT Q1 can be turned on/off.

<Structure of Diode>

Figure 4:
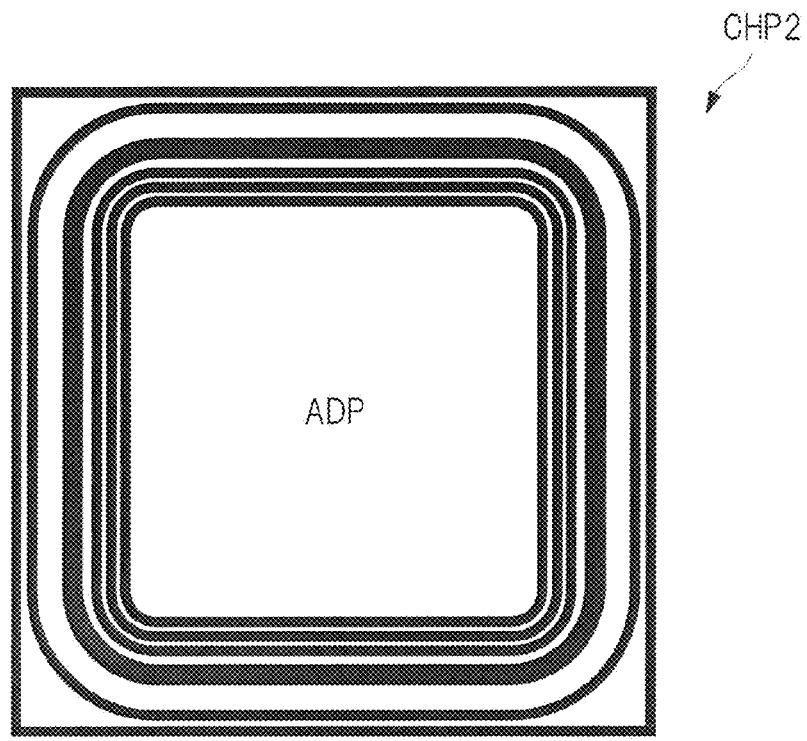
FIG. 4 is a plan view illustrating an outer shape of a semiconductor in which a diode is formed.

Next, FIG. 4 is a plan view illustrating an outer shape of a semiconductor chip CHP2 in which the diode FWD is formed. In FIG. 4, a main surface (front surface) of the semiconductor chip CHP2 is illustrated. As illustrated in FIG. 4, a planar shape of the semiconductor chip CHP2 in the first embodiment is a square shape. Also, an anode electrode pad ADP is formed on the front surface of the semiconductor chip CHP2 having the square shape. Meanwhile, though not illustrated, a cathode electrode pad is formed on an entire rear surface on an opposite side of the front surface of the semiconductor chip CHP2.

Figure 5:
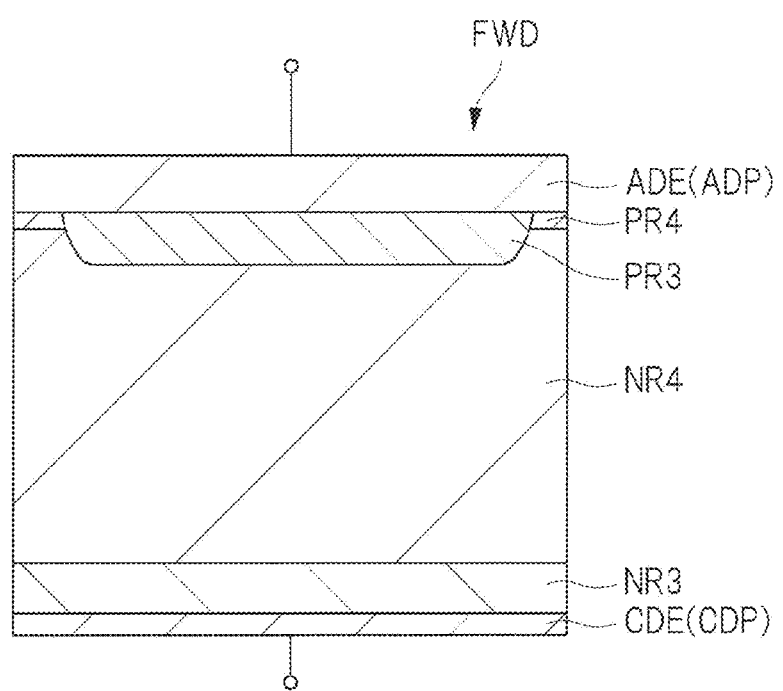
FIG. 5 is a cross-sectional view illustrating a device structure of the diode.

Subsequently, the device structure of the diode FWD will be described. FIG. 5 is a cross-sectional view illustrating the device structure of the diode FWD. In FIG. 5, a cathode electrode CDE (cathode electrode pad CDP) is formed on the rear surface of a semiconductor chip, and an $n^+$ type semiconductor region NR3 is formed on the cathode electrode CDE. Further, an $n^-$ type semiconductor region NR4 is formed on the $n^+$ type semiconductor region NR3, and a p type semiconductor region PR3 is formed on the $n^-$ type semiconductor region NR4. An anode electrode ADE (anode electrode pad ADP) is formed on the p type semiconductor region PR3 and a $p^-$ type semiconductor region PR4. The anode electrode ADE is made of, for example, aluminum-silicon.

<Operation of Diode>

According to the diode FWD configured as described above, when a positive voltage is applied to the anode electrode ADE and a negative voltage is applied to the cathode electrode CDE, a pn junction between the $n^-$ type semiconductor region NR4 and the p type semiconductor region PR3 is forward-biased and a current flows therethrough. On the other hand, when a negative voltage is applied to the anode electrode ADE and a positive voltage is applied to the cathode electrode CDE, the pn junction between the $n^-$ type semiconductor region NR4 and the p type semiconductor region PR3 is reverse-biased and no current flows therethrough. In this way, the diode FWD having a rectifying function can be operated.

<Mounting Configuration of Semiconductor Device in First Embodiment> (SOP Structure)

The inverter circuit INV illustrated in FIG. 1 described above is embodied by, for example, a semiconductor device (semiconductor package) including the six semiconductor chips CHP1 each having the IGBT Q1 formed therein and the six semiconductor chip CHP2 each having the diode FWD formed therein as one package. Namely, the inverter circuit INV illustrated in FIG. 1 is realized by a single semiconductor device in the first embodiment. Hereinafter, a mounting configuration of the semiconductor device will be described.

Figure 6:
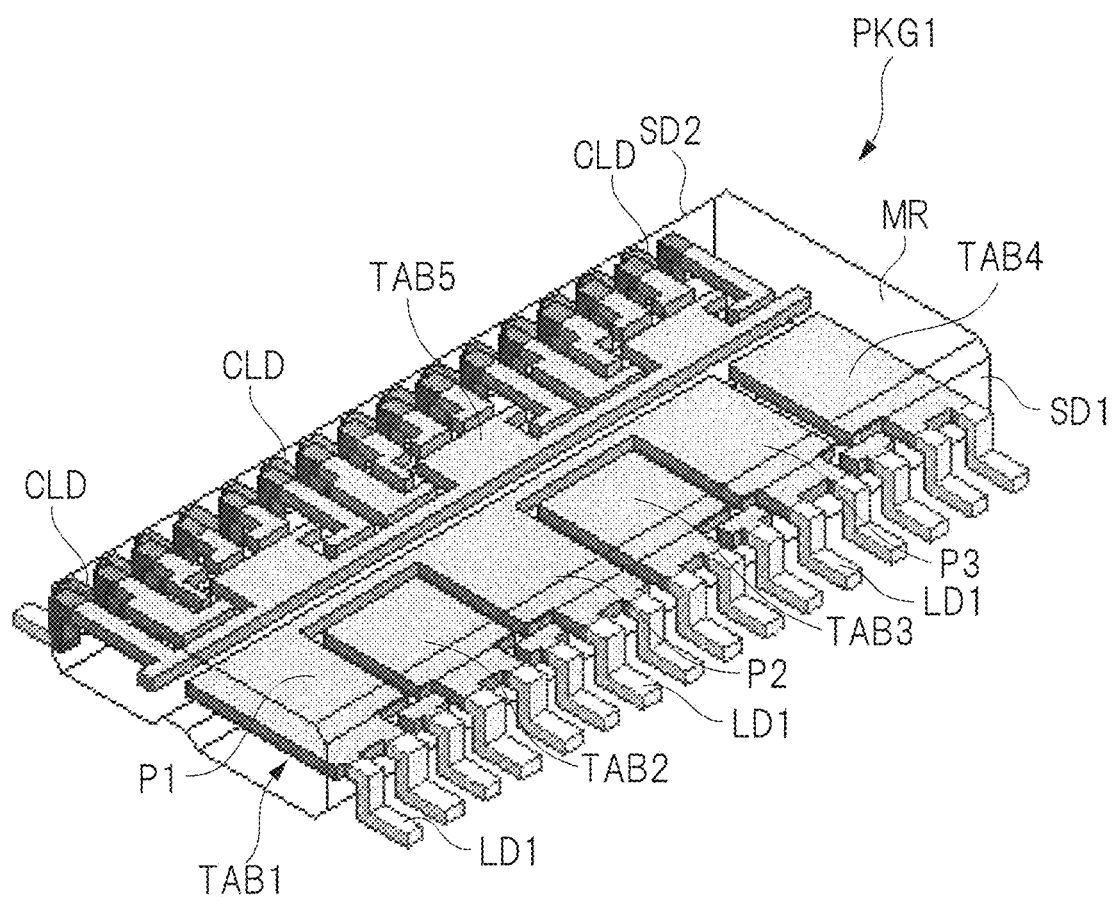
FIG. 6 is a perspective view illustrating the semiconductor device in the first embodiment which is viewed from an upper surface side of the sealing member.
Figure 6:
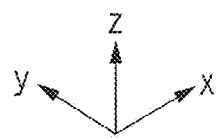

FIG. 6 is a diagram illustrating an external configuration of a semiconductor device PKG1 in the first embodiment. The semiconductor device PKG1 in the first embodiment has a sealing member MR made of, for example, resin, and FIG. 6 illustrates an internal configuration of the semiconductor device PKG1 which is viewed through the sealing member MR. FIG. 6 corresponds to a perspective view of the semiconductor device PKG1 in the first embodiment which is viewed from an upper surface side of the sealing member MR.

In FIG. 6, the sealing member MR has an upper surface, a lower surface positioned on the opposite side of the upper surface, a side surface SD1 positioned between the upper surface and the lower surface in a thickness direction thereof (z direction), and a side surface SD2 facing the side surface SD1. Further, the side surface SD1 and the side surface SD2 of the sealing member MR both extend in an x direction (first direction).

Here, as illustrated in FIG. 6, the semiconductor device PKG1 in the first embodiment has a chip mounting part TAB1, a chip mounting part TAB2, a chip mounting part TAB3, a chip mounting part TAB4 and a plurality of chip mounting parts TAB5 inside the sealing member MR. Namely, the chip mounting part TAB1 to the chip mounting part TAB5 are sealed by the sealing member MR.

Further, as illustrated in FIG. 6, the chip mounting part TAB1 has a first portion P1, a second portion P2 and a third portion P3 which are formed in an integrated manner. At this time, the first portion P1, the second portion P2 and the third portion P3 of the chip mounting part TAB1 are arranged to be partially spaced apart from each other and be arranged in the x direction. Further, the chip mounting part TAB2 is arranged to be spaced apart from and sandwiched between the first portion P1 and the second portion P2, and the chip mounting part TAB3 is arranged to be spaced apart from and sandwiched between the second portion P2 and the third portion P3. In addition, the chip mounting part TAB4 is arranged so that the third portion P3 of the chip mounting part TAB1 is spaced apart from and sandwiched between the chip mounting part TAB3 and the chip mounting part TAB4. Meanwhile, the plurality of chip mounting parts TAB5 are arranged so as to be spaced apart in a y direction from the chip mounting part TAB1 to the chip mounting part TAB4 arranged in the x direction. The plurality of chip mounting parts TAB5 are connected to each other and arranged to be arranged in the x direction.

As described above, in the semiconductor device PKG1 in the first embodiment, the chip mounting part TAB1 to the chip mounting part TAB4 are arranged along the x direction in which the side surface SD1 of the sealing member MR extends as illustrated in FIG. 6. Further, the chip mounting part TAB2 is arranged between the first portion P1 and the second portion P2 of the chip mounting part TAB1 when seen in a plan view, and the second portion P2 of the chip mounting part TAB1 is arranged between the chip mounting part TAB2 and the chip mounting part TAB3 when seen in a plan view. Further, the chip mounting part TAB3 is arranged between the second portion P2 and the third portion P3 of the chip mounting part TAB1 when seen in a plan view, and the third portion P3 of the chip mounting part TAB1 is arranged between the chip mounting part TAB3 and the chip mounting part TAB4 when seen in a plan view.

Next, each of the chip mounting part TAB1 to the chip mounting part TAB4 is connected to a lead LD1, a part of each of the leads LD1 is sealed by the sealing member MR. In other words, each of the leads LD1 has a protruding portion which protrudes from the side surface SD1 of the sealing member MR and the protruding portion of the lead LD1 is configured to include a part capable of being connected to a mounting substrate in order to mount the semiconductor device PKG1 on the mounting substrate. For example, as illustrated in FIG. 6, the lead LD1 is processed to have a gull-wing shape, and a distal end portion of the gull-wing shape serves as a part capable of being soldered with the mounting substrate. Namely, the protruding portion of the lead LD1 has the part capable of being soldered with the mounting substrate as the part capable of being connected to the mounting substrate in the semiconductor device PKG1 in the first embodiment illustrated in FIG. 6.

In this manner, the plurality of leads LD1 are disposed to be arranged in the x direction, and include the lead LD1 connected to the chip mounting part TAB1, the lead LD1 connected to the chip mounting part TAB2, the lead LD1 connected to the chip mounting part TAB3, and the lead LD1 connected to the chip mounting part TAB4. Further, the plurality of leads LD1 include the lead LD1 connected to the first portion P1 of the chip mounting part TAB1, the lead LD1 connected to the second portion P2 of the chip mounting part TAB1, and the lead LD1 connected to the third portion P3 of the chip mounting part TAB1, and also include the lead LD1 arranged to be spaced apart from any of the chip mounting part TAB1 to the chip mounting part TAB4.

Meanwhile, as illustrated in FIG. 6, the semiconductor device PKG1 in the first embodiment has a plurality of control leads CLD each having a protruding portion, which protrudes from the side surface SD2 of the sealing member MR, and partially sealed by the sealing member MR. Further, the protruding portion of the control lead CLD is also configured to include a part capable of being connected to the mounting substrate in order to mount the semiconductor device PKG1 on the mounting substrate. For example, as illustrated in FIG. 6, the control lead CLD is processed to have a gull-wing shape, and a distal end portion of the gull-wing shape serves as apart capable of being soldered with the mounting substrate. Namely, in the semiconductor device PKG1 in the first embodiment illustrated in FIG. 6, the protruding portion of the control lead CLD has the part capable of being soldered with the mounting substrate as the part capable of being connected to the mounting substrate. Further, the plurality of control leads CLD are disposed to be arranged in the x direction, and include the control lead CLD connected to the chip mounting part TAB5 and the control lead CLD arranged to be spaced apart from the chip mounting part TAB5.

Figure 7:
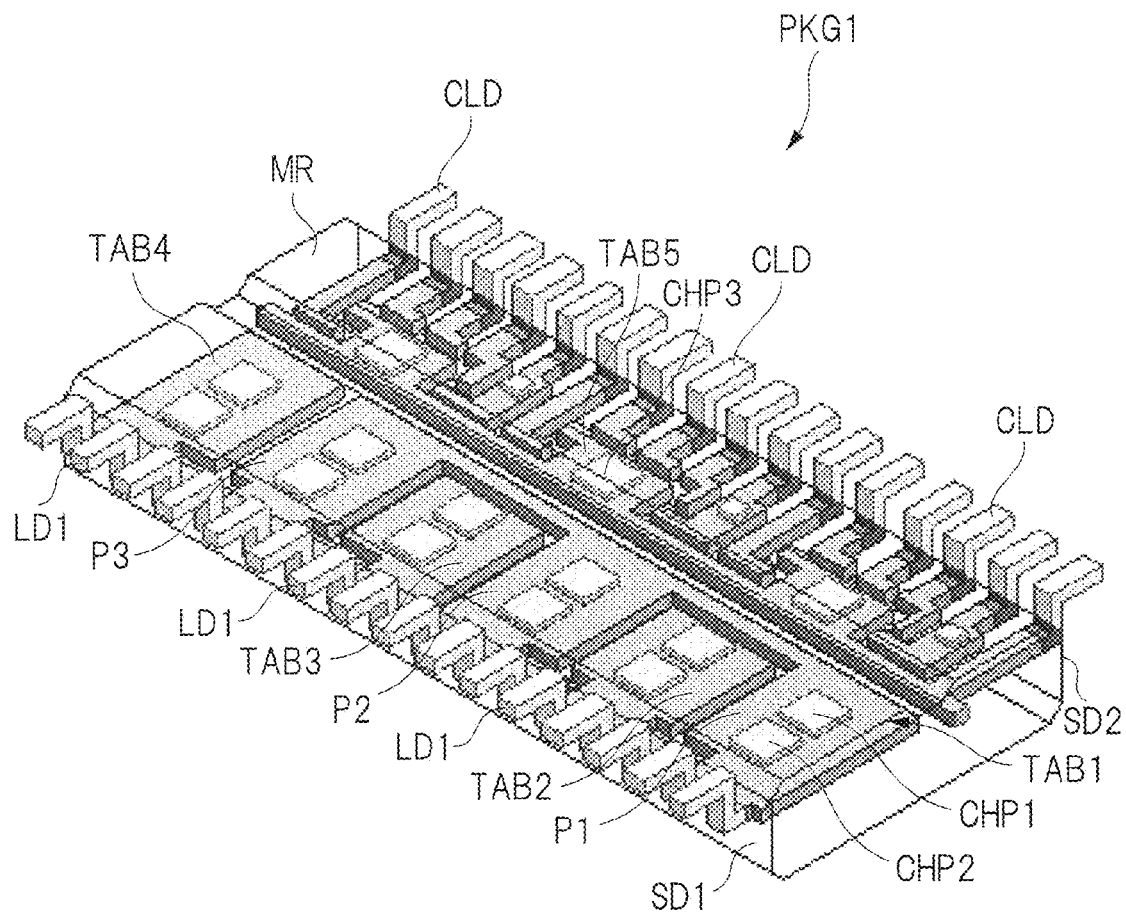
FIG. 7 is a perspective view illustrating the semiconductor device in the first embodiment which is viewed from a lower surface side of the sealing member.
Figure 7:
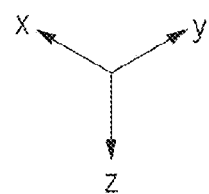

Subsequently, FIG. 7 is a perspective view illustrating the semiconductor device PKG1 in the first embodiment which is viewed from a lower surface side of the sealing member MR. FIG. 7 also illustrates the internal configuration of the semiconductor device PKG1 which is viewed through the sealing member MR. Note that a wire W (see FIGS. 8 and 10) to be described later is not illustrated in FIG. 7 (similarly in FIGS. 14 and 16) for convenience of the description.

As illustrated in FIG. 7, the semiconductor chip CHP1 in which the IGBT is formed and the semiconductor chip CHP2 in which the diode is formed are mounted on each of a rear surface of the first portion P1, a rear surface of the second portion P2 and a rear surface of the third portion P3 of the chip mounting part TAB1. Similarly, the semiconductor chip CHP1 in which the IGBT is formed and the semiconductor chip CHP2 in which the diode is formed are mounted also on each rear surface of the chip mounting part TAB2 to the chip mounting part TAB4. Further, a semiconductor chip CHP3 which constitutes the gate control circuit GCC illustrated in FIG. 1 is mounted on each rear surface of the plurality of chip mounting parts TAB5.

From the foregoing, the semiconductor device PKG1 in the first embodiment includes the six semiconductor chips CHP1, the six semiconductor chips CHP2 and the three semiconductor chips CHP3, which constitute the inverter circuit INV illustrated in FIG. 1, inside the sealing member MR. Specifically, the semiconductor chip CHP1 and the semiconductor chip CHP2, which are mounted on the rear surface of the first portion P1 of the chip mounting part TAB1 in FIG. 7, constitute the upper arm of the first leg LG1 illustrated in FIG. 1. In addition, the semiconductor chip CHP1 and the semiconductor chip CHP2, which are mounted on the rear surface of the second portion P2 of the chip mounting part TAB1, constitute the upper arm of the second leg LG2 illustrated in FIG. 1. Further, the semiconductor chip CHP1 and the semiconductor chip CHP2, which are mounted on the rear surface of the third portion P3 of the chip mounting part TAB1, constitute the upper arm of the third leg LG3 illustrated in FIG. 1.

Meanwhile, the semiconductor chip CHP1 and the semiconductor chip CHP2, which are mounted on the rear surface of the chip mounting part TAB2 in FIG. 7, constitute the lower arm of the first leg LG1 illustrated in FIG. 1. In addition, the semiconductor chip CHP1 and the semiconductor chip CHP2, which are mounted on the rear surface of the chip mounting part TAB3, constitute the lower arm of the second leg LG2 illustrated in FIG. 1. Further, the semiconductor chip CHP1 and the semiconductor chip CHP2, which are mounted on the rear surface of the chip mounting part TAB4, constitute the lower arm of the third leg LG3 illustrated in FIG. 1.

Further, for example, the gate control circuit GCC is formed in the semiconductor chip CHP3 mounted on the rear surface of the chip mounting part TAB5 which is arranged near the periphery of the first portion P1 of the chip mounting part TAB1 and the chip mounting part TAB2. This gate control circuit GCC controls a gate electrode of an IGBT which is formed in the semiconductor chip CHP1 on the rear surface of the first portion P1, and further, controls a gate electrode of an IGBT which is formed in the semiconductor chip CHP1 on the rear surface of the chip mounting part TAB2. Namely, the gate control circuit GCC, which controls switching of the IGBT constituting the upper arm of the first leg LG1 illustrated in FIG. 1 and the IGBT constituting the lower arm thereof, is formed in the semiconductor chip CHP3 on the rear surface of the chip mounting part TAB5 which is arranged near the periphery of the first portion P1 of the chip mounting part TAB1 and the chip mounting part TAB2.

In addition, for example, the gate control circuit GCC is formed in the semiconductor chip CHP3 mounted on the rear surface of the chip mounting part TAB5 which is arranged near the periphery of the second portion P2 of the chip mounting part TAB1 and the chip mounting part TAB3. This gate control circuit GCC controls the gate electrode of the IGBT formed in the semiconductor chip CHP1 on the rear surface of the second portion P2, and further, controls the gate electrode of the IGBT formed in the semiconductor chip CHP1 on the rear surface of the chip mounting part TAB3. Namely, the gate control circuit GCC, which controls switching of the IGBT constituting the upper arm of the second leg LG2 illustrated in FIG. 1 and the IGBT constituting the lower arm thereof, is formed in the semiconductor chip CHP3 on the rear surface of the chip mounting part TAB5 which is arranged near the periphery of the second portion P2 of the chip mounting part TAB1 and the chip mounting part TAB3.

Further, for example, the gate control circuit GCC is formed in the semiconductor chip CHP3 mounted on the rear surface of the chip mounting part TAB5 which is arranged near the periphery of the third portion P3 of the chip mounting part TAB1 and the chip mounting part TAB4. This gate control circuit GCC controls the gate electrode of the IGBT which is formed in the semiconductor chip CHP1 on the rear surface of the third portion P3, and further, controls the gate electrode of the IGBT which is formed in the semiconductor chip CHP1 on the rear surface of the chip mounting part TAB4. Namely, the gate control circuit GCC, which controls switching of the IGBT constituting the upper arm of the third leg LG3 illustrated in FIG. 1 and the IGBT constituting the lower arm thereof, is formed in the semiconductor chip CHP3 on the rear surface of the chip mounting part TAB5 which is arranged near the periphery of the third portion P3 of the chip mounting part TAB1 and the chip mounting part TAB4.

Figure 8:
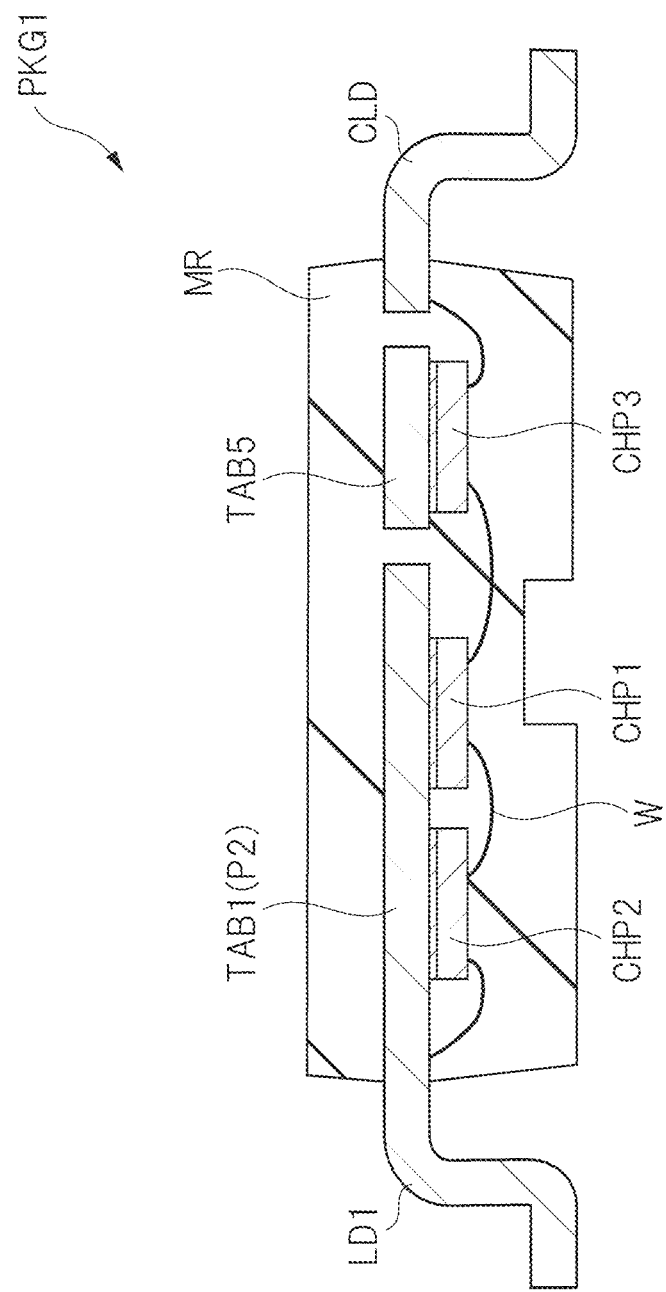
FIG. 8 is a cross-sectional view illustrating the semiconductor device in the first embodiment which is cut along a cross section.

Next, FIG. 8 is a cross-sectional view illustrating the semiconductor device PKG1 in the first embodiment which is cut along a cross section. FIG. 8 illustrates the second portion P2 of the chip mounting part TAB1 which is present in the semiconductor device PKG1 in the first embodiment, and the semiconductor chip CHP1 in which the IGBT is formed and the semiconductor chip CHP2 in which the diode is formed are mounted on the rear surface of the second portion P2 of the chip mounting part TAB1 via a conductive adhesive material. Meanwhile, the chip mounting part TAB5 is arranged to be spaced apart from the second portion P2 of the chip mounting part TAB1, and the semiconductor chip CHP3 in which the gate control circuit is formed is mounted on the rear surface of the chip mounting part TAB5 via a conductive adhesive material. Further, the semiconductor chip CHP1 and the semiconductor chip CHP2 mounted on the rear surface of the second portion P2 of the chip mounting part TAB1 are electrically connected with each other via the wire W which is a conductive member, and further, the semiconductor chip CHP1 is electrically connected with the semiconductor chip CHP3 mounted on the rear surface of the chip mounting part TAB5 via the wire W. Further, the second portion P2 of the chip mounting part TAB1 is connected to the lead LD1, and a part of the lead LD1 protrudes from the sealing member MR. Similarly, a part of the control lead CLD which is arranged to be spaced apart from the chip mounting part TAB5 also protrudes from the sealing member MR, and the control lead CLD and the semiconductor chip CHP3 are electrically connected with each other via the wire W. Meanwhile, as illustrated in FIG. 8, the second portion P2 of the chip mounting part TAB1, the chip mounting part TAB5, the semiconductor chip CHP1 to the semiconductor chip CHP3, the wire W, the other part of the lead LD1, and the other part of the control lead CLD are sealed by the sealing member MR.

Figure 9:
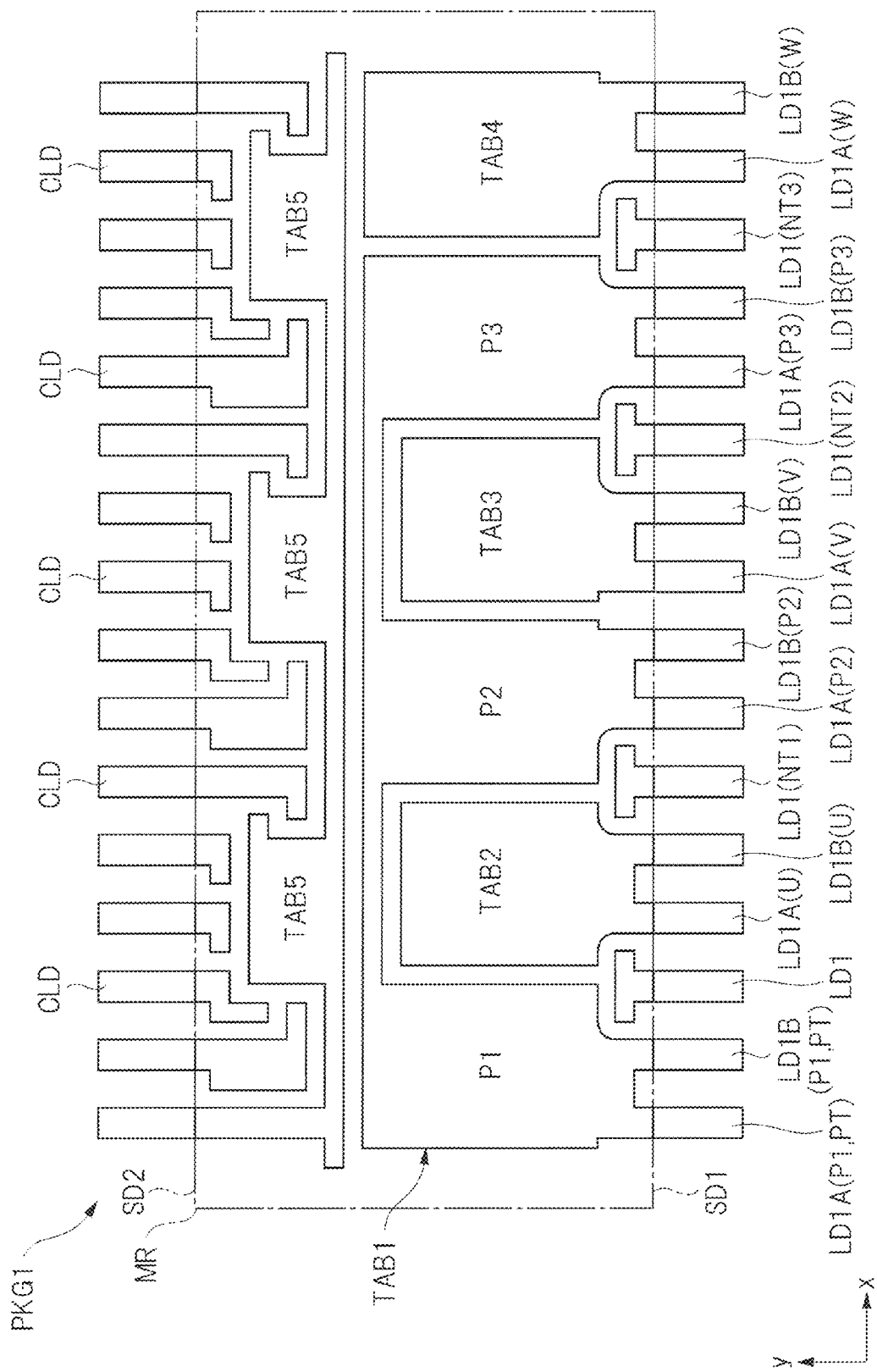
FIG. 9 is a plan view illustrating the semiconductor device in the first embodiment which is viewed through the sealing member from the upper surface side of the sealing member.

Subsequently, FIG. 9 is a plan view illustrating the semiconductor device PKG1 in the first embodiment which is viewed through the sealing member MR from the upper surface side of the sealing member MR. In FIG. 9, a lead LD1A(P1, PT) and a lead LD1B(P1, PT) are connected to the first portion P1 of the chip mounting part TAB1, and a protruding portion of the lead LD1A(P1, PT) and a protruding portion of the lead LD1B(P1, PT) protrude from the side surface SD1 of the sealing member MR. The lead LD1A(P1, PT) and the lead LD1B(P1, PT) are electrically connected with, for example, the positive potential terminal (power supply potential terminal) PT illustrated in FIG. 1, and accordingly, a positive potential (power supply potential) is supplied to the chip mounting part TAB1.

Next, a lead LD1A(U) and a lead LD1B(U) are connected to the chip mounting part TAB2, and a protruding portion of the lead LD1A(U) and a protruding portion of the lead LD1B(U) protrude from the side surface SD1 of the sealing member MR. The lead LD1A(U) and the lead LD1B(U) are electrically connected with, for example, the U phase of the three-phase induction motor MT illustrated in FIG. 1. Accordingly, the chip mounting part TAB2 is electrically connected with the U phase of the three-phase induction motor MT via the lead LD1A(U) and the lead LD1B(U).

Further, the lead LD1 is formed so as to be spaced apart from and sandwiched between the lead LD1B(P1, PT) connected to the first portion P1 of the chip mounting part TAB1 and the lead LD1A(U) connected to the chip mounting part TAB2 when seen in a plan view.

Subsequently, as illustrated in FIG. 9, a lead LD1A(P2) and a lead LD1B(P2) are connected to the second portion P2 of the chip mounting part TAB1, and a protruding portion of the lead LD1A(P2) and a protruding portion of the lead LD1B(P2) protrude from the side surface SD1 of the sealing member MR. At this time, since the second portion P2 of the chip mounting part TAB1 is connected to the first portion P1 of the chip mounting part TAB1 and the positive potential is supplied to the first portion P1, the lead LD1A(P2) and the lead LD1B(P2) are not necessarily linked to the positive potential terminal PT illustrated in FIG. 1 in the first embodiment.

Further, a lead LD1(NT1) is formed so as to be spaced apart from and sandwiched between the lead LD1B(U) connected to the chip mounting part TAB2 and the lead LD1A(P2) connected to the second portion P2 of the chip mounting part TAB1 when seen in a plan view. The lead LD1(NT1) is electrically connected with, for example, the negative potential terminal NT illustrated in FIG. 1.

Next, a lead LD1A(V) and a lead LD1B(V) are connected to the chip mounting part TAB3, and a protruding portion of the lead LD1A(V) and a protruding portion of the lead LD1B(V) protrude from the side surface SD1 of the sealing member MR. The lead LD1A(V) and the lead LD1B(V) are electrically connected with, for example, the V phase of the three-phase induction motor MT illustrated in FIG. 1. Accordingly, the chip mounting part TAB3 is electrically connected with the V phase of the three-phase induction motor MT via the lead LD1A(V) and the lead LD1B(V).

Subsequently, as illustrated in FIG. 9, the lead LD1A(P3) and the lead LD1B(P3) are connected to the third portion P3 of the chip mounting part TAB1, and a protruding portion of the lead LD1A(P3) and a protruding portion of the lead LD1B(P3) protrude from the side surface SD1 of the sealing member MR. At this time, since the third portion P3 of the chip mounting part TAB1 is connected to the first portion P1 of the chip mounting part TAB1 and the positive potential is supplied to the first portion P1, the lead LD1A(P3) and the lead LD1B(P3) are not necessarily linked to the positive potential terminal PT illustrated in FIG. 1 in the first embodiment.

Further, a lead LD1(NT2) is formed so as to be spaced apart from and sandwiched between the lead LD1B(V) connected to the chip mounting part TAB3 and the lead LD1A(P3) connected to the third portion P3 of the chip mounting part TAB1 when seen in a plan view. The lead LD1(NT2) is electrically connected with, for example, the negative potential terminal NT illustrated in FIG. 1.

Next, a lead LD1A(W) and a lead LD1B(W) are connected to the chip mounting part TAB4, and a protruding portion of the lead LD1A(W) and a protruding portion of the lead LD1B(W) protrude from the side surface SD1 of the sealing member MR. The lead LD1A(W) and the lead LD1B(W) are electrically connected with, for example, the W phase of the three-phase induction motor MT illustrated in FIG. 1. Accordingly, the chip mounting part TAB4 is electrically connected with the W phase of the three-phase induction motor MT via the lead LD1A(W) and the lead LD1B(W).

Meanwhile, as illustrated in FIG. 9, the respective protruding portions of the plurality of control leads CLD protrude from the side surface SD2 of the sealing member MR. The plurality of control leads CLD include the control lead CLD which is connected to the chip mounting part TAB5 and the control lead CLD which is not connected to the chip mounting part TAB5.

Figure 10:
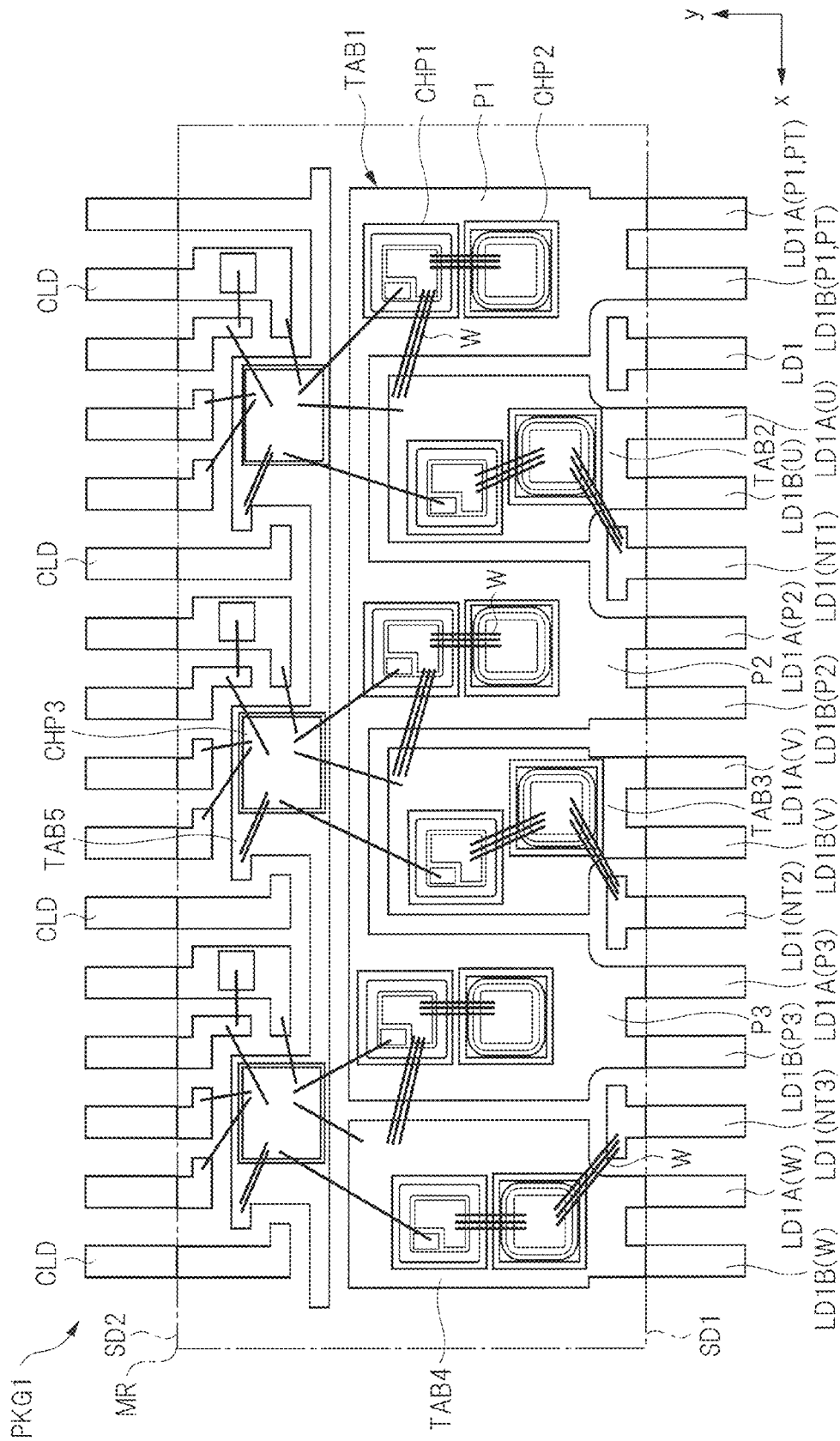
FIG. 10 is a plan view illustrating the semiconductor device in the first embodiment which is viewed through the sealing member from the lower surface side of the sealing member.

Subsequently, FIG. 10 is a plan view illustrating the semiconductor device PKG1 in the first embodiment which is viewed through the sealing member MR from the lower surface side of the sealing member MR. In FIG. 10, first, the semiconductor chip CHP1 in which the IGBT is formed and the semiconductor chip CHP2 in which the diode is formed are mounted on each rear surface of the first portion P1 to the third portion P3 of the chip mounting part TAB1. Accordingly, a rear surface electrode of the semiconductor chip CHP1 mounted on the first portion P1, a rear surface electrode of the semiconductor chip CHP1 mounted on the second portion P2, and a rear surface electrode of the semiconductor chip CHP1 mounted on the third portion P3 are electrically connected with each other via the chip mounting part TAB1 when considering that the first portion P1 to the third portion P3 of the chip mounting part TAB1 are connected to each other. At this time, for example, the rear surface electrode of the semiconductor chip CHP1 functions as a collector of the IGBT when considering that the IGBT is formed in the semiconductor chip CHP1 as illustrated in FIG. 3. Accordingly, the collector of the semiconductor chip CHP1 which is mounted on each rear surface of the first portion P1 to the third portion P3 is electrically connected via the chip mounting part TAB1 in the semiconductor device PKG1 in the first embodiment.

Similarly, a rear surface electrode of the semiconductor chip CHP2 mounted on the first portion P1, a rear surface electrode of the semiconductor chip CHP2 mounted on the second portion P2, and a rear surface electrode of the semiconductor chip CHP2 mounted on the third portion P3 are electrically connected with each other via the chip mounting part TAB1 when considering that the first portion P1 to the third portion P3 of the chip mounting part TAB1 are connected to each other. At this time, for example, the rear surface electrode of the semiconductor chip CHP2 functions as a cathode of the diode when considering that the diode is formed in the semiconductor chip CHP2 as illustrated in FIG. 5. Accordingly, the cathode of the semiconductor chip CHP2 which is mounted on each rear surface of the first portion P1 to the third portion P3 is electrically connected via the chip mounting part TAB1 in the semiconductor device PKG1 in the first embodiment.

Accordingly, the collectors of the IGBTs and the cathodes of the diodes are electrically connected with each other in the three semiconductor chips CHP1 and the three semiconductor chips CHP2 which are mounted on the rear surfaces of the first portion P1 to the third portion P3 of the chip mounting part TAB1.

Next, in FIG. 10, the semiconductor chip CHP1 in which the IGBT is formed and the semiconductor chip CHP2 in which the diode is formed are mounted on the rear surface of the chip mounting part TAB2. Accordingly, a rear surface electrode of the semiconductor chip CHP1 which is mounted on the rear surface of the chip mounting part TAB2 and the rear surface of the chip mounting part TAB2 are electrically connected with each other. At this time, since the rear surface electrode of the semiconductor chip CHP1 functions as the collector of the IGBT, the collector of the semiconductor chip CHP1 mounted on the chip mounting part TAB2 is electrically connected with the rear surface of the chip mounting part TAB2 in the semiconductor device PKG1 in the first embodiment. In addition, the semiconductor chip CHP2 in which the diode is formed is also mounted on the rear surface of the chip mounting part TAB2. Accordingly, a rear surface electrode of the semiconductor chip CHP2 which is mounted on the rear surface of the chip mounting part TAB2 and the rear surface of the chip mounting part TAB2 are electrically connected with each other. At this time, since the rear surface electrode of the semiconductor chip CHP2 functions as the cathode of the diode, the cathode of the semiconductor chip CHP2 which is mounted on the chip mounting part TAB2 is electrically connected with the rear surface of the chip mounting part TAB2 in the semiconductor device PKG1 in the first embodiment. Accordingly, the collector of the IGBT and the cathode of the diode are electrically connected with each other in the semiconductor chip CHP1 and the semiconductor chip CHP2 mounted on the rear surface of the chip mounting part TAB2.

Subsequently, in FIG. 10, the semiconductor chip CHP1 in which the IGBT is formed and the semiconductor chip CHP2 in which the diode is formed are mounted on the rear surface of the chip mounting part TAB3. Accordingly, a rear surface electrode of the semiconductor chip CHP1 mounted on the rear surface of the chip mounting part TAB3 and the rear surface of the chip mounting part TAB3 are electrically connected with each other. At this time, since the rear surface electrode of the semiconductor chip CHP1 functions as the collector of the IGBT, the collector of the semiconductor chip CHP1 mounted on the chip mounting part TAB3 is electrically connected with the rear surface of the chip mounting part TAB3 in the semiconductor device PKG1 in the first embodiment. In addition, the semiconductor chip CHP2 in which the diode is formed is also mounted on the rear surface of the chip mounting part TAB3. Accordingly, a rear surface electrode of the semiconductor chip CHP2 which is mounted on the rear surface of the chip mounting part TAB3 and the rear surface of the chip mounting part TAB3 are electrically connected with each other. At this time, since the rear surface electrode of the semiconductor chip CHP2 functions as the cathode of the diode, the cathode of the semiconductor chip CHP2 which is mounted on the chip mounting part TAB3 is electrically connected with the rear surface of the chip mounting part TAB3 in the semiconductor device PKG1 in the first embodiment. Accordingly, the collector of the IGBT and the cathode of the diode are electrically connected with each other in the semiconductor chip CHP1 and the semiconductor chip CHP2 mounted on the rear surface of the chip mounting part TAB3.

Further, in FIG. 10, the semiconductor chip CHP1 in which the IGBT is formed and the semiconductor chip CHP2 in which the diode is formed are mounted on the rear surface of the chip mounting part TAB4. Accordingly, a rear surface electrode of the semiconductor chip CHP1 mounted on the rear surface of the chip mounting part TAB4 and the rear surface of the chip mounting part TAB4 are electrically connected with each other. At this time, since the rear surface electrode of the semiconductor chip CHP1 functions as the collector of the IGBT, the collector of the semiconductor chip CHP1 mounted on the chip mounting part TAB4 is electrically connected with the rear surface of the chip mounting part TAB4 in the semiconductor device PKG1 in the first embodiment. In addition, the semiconductor chip CHP2 in which the diode is formed is also mounted on the rear surface of the chip mounting part TAB4. Accordingly, a rear surface electrode of the semiconductor chip CHP2 which is mounted on the rear surface of the chip mounting part TAB4 and the rear surface of the chip mounting part TAB4 are electrically connected with each other. At this time, since the rear surface electrode of the semiconductor chip CHP2 functions as the cathode of the diode, the cathode of the semiconductor chip CHP2 which is mounted on the chip mounting part TAB4 is electrically connected with the rear surface of the chip mounting part TAB4 in the semiconductor device PKG1 in the first embodiment. Accordingly, the collector of the IGBT and the cathode of the diode are electrically connected with each other in the semiconductor chip CHP1 and the semiconductor chip CHP2 mounted on the rear surface of the chip mounting part TAB4.

Meanwhile, as illustrated in FIG. 10, for example, the semiconductor chip CHP3 in which the gate control circuit GCC illustrated in FIG. 1 is mounted on the rear surface of the chip mounting part TAB5.

Next, as illustrated in FIG. 10, a front surface electrode which is formed on the front surface of the semiconductor chip CHP1 mounted on the rear surface of the first portion P1 of the chip mounting part TAB1 is electrically connected with the rear surface of the chip mounting part TAB2 via the wire W. Namely, an emitter electrode pad formed on the front surface of the semiconductor chip CHP1 is electrically connected with the rear surface of the chip mounting part TAB2 via the wire W when considering that the IGBT is formed in the semiconductor chip CHP1. In addition, the emitter electrode pad of the semiconductor chip CHP1 mounted on the rear surface of the first portion P1 and an anode electrode pad of the semiconductor chip CHP2 mounted on the rear surface of the first portion P1 are electrically connected with each other via the wire W. Further, a gate electrode pad of the semiconductor chip CHP1 mounted on the rear surface of the first portion P1 is electrically connected with a pad of the semiconductor chip CHP3 mounted on the rear surface of the chip mounting part TAB5.

Similarly, an emitter electrode pad formed on the front surface of the semiconductor chip CHP1 mounted on the rear surface of the second portion P2 of the chip mounting part TAB1 is electrically connected with the rear surface of the chip mounting part TAB3 via the wire W. In addition, the emitter electrode pad of the semiconductor chip CHP1 mounted on the rear surface of the second portion P2 and an anode electrode pad of the semiconductor chip CHP2 mounted on the rear surface of the second portion P2 are electrically connected with each other via the wire W. Further, a gate electrode pad of the semiconductor chip CHP1 mounted on the rear surface of the second portion P2 is electrically connected with a pad of the semiconductor chip CHP3 mounted on the rear surface of the chip mounting part TAB5.

Similarly, an emitter electrode pad formed on the front surface of the semiconductor chip CHP1 mounted on the rear surface of the third portion P3 of the chip mounting part TAB1 is electrically connected with the rear surface of the chip mounting part TAB4 via the wire W. In addition, the emitter electrode pad of the semiconductor chip CHP1 mounted on the rear surface of the third portion P3 and an anode electrode pad of the semiconductor chip CHP2 mounted on the rear surface of the third portion P3 are electrically connected with each other via the wire W. Further, a gate electrode pad of the semiconductor chip CHP1 mounted on the rear surface of the third portion P3 is electrically connected with a pad of the semiconductor chip CHP3 mounted on the rear surface of the chip mounting part TAB5.

Further, as illustrated in FIG. 10, an emitter electrode pad formed on the front surface of the semiconductor chip CHP1 mounted on the rear surface of the chip mounting part TAB2 and an anode electrode pad formed on the front surface of the semiconductor chip CHP2 mounted on the rear surface of the chip mounting part TAB2 are electrically connected with each other via the wire W. In addition, a gate electrode pad of the semiconductor chip CHP1 mounted on the rear surface of the chip mounting part TAB2 is electrically connected with a pad of the semiconductor chip CHP3 mounted on the rear surface of the chip mounting part TAB5. Further, an anode electrode pad formed on the front surface of the semiconductor chip CHP2 mounted on the rear surface of the chip mounting part TAB2 is electrically connected with the lead LD1(NT1) via the wire W.

Similarly, an emitter electrode pad formed on the front surface of the semiconductor chip CHP1 mounted on the rear surface of the chip mounting part TAB3 and an anode electrode pad formed on the front surface of the semiconductor chip CHP2 mounted on the rear surface of the chip mounting part TAB3 are electrically connected with each other via the wire W. In addition, a gate electrode pad of the semiconductor chip CHP1 mounted on the rear surface of the chip mounting part TAB3 is electrically connected with a pad of the semiconductor chip CHP3 mounted on the rear surface of the chip mounting part TAB5. Further, an anode electrode pad formed on the front surface of the semiconductor chip CHP2 mounted on the rear surface of the chip mounting part TAB3 is electrically connected with the lead LD1(NT2) via the wire W.

Similarly, an emitter electrode pad formed on the front surface of the semiconductor chip CHP1 mounted on the rear surface of the chip mounting part TAB4 and an anode electrode pad formed on the front surface of the semiconductor chip CHP2 mounted on the rear surface of the chip mounting part TAB4 are electrically connected with each other via the wire W. In addition, a gate electrode pad of the semiconductor chip CHP1 mounted on the rear surface of the chip mounting part TAB4 is electrically connected with a pad of the semiconductor chip CHP3 mounted on the rear surface of the chip mounting part TAB5. Further, an anode electrode pad formed on the front surface of the semiconductor chip CHP2 mounted on the rear surface of the chip mounting part TAB4 is electrically connected with the lead LD1(NT3) via the wire W.

In the manner described above, the semiconductor device PKG1 in the first embodiment is mounted and configured.

Characteristics in First Embodiment

Next, characteristic points in the first embodiment will be described. A first characteristic point in the first embodiment is that the lead LD1A(P2) connected to the second portion P2 of the chip mounting part TAB1 is provided and a part of the lead LD1A(P2) protrudes from the side surface SD1 of the sealing member MR as illustrated in FIGS. 9 and 10. Further, the first characteristic point in the first embodiment is that the lead LD1A(P3) connected to the third portion P3 of the chip mounting part TAB1 is provided and a part of the lead LD1A(P3) protrudes from the side surface SD1 of the sealing member MR. Namely, the first characteristic point in the first embodiment is that the lead LD1A(P2) connected to the second portion P2 and the lead LD1A(P3) connected to the third portion P3 of the chip mounting part TAB1 are provided, and the lead LD1A(P2) and the lead LD1A(P3) respectively have the protruding portions that protrude from the sealing member MR. Accordingly, in the first embodiment, it is possible to enhance a heat dissipation characteristic of the semiconductor device PKG1. Hereinafter, the first characteristic point will be described in detail.

As illustrated in FIGS. 9 and 10, for example, the first portion P1 to the third portion P3 of the chip mounting part TAB1 are connected to each other in the integrated manner. Therefore, it is enough when the lead LD1A(P1, PT) connected to the first portion P1 is provided and the lead LD1A(P1, PT) is electrically connected with the positive potential terminal PT illustrated in FIG. 1. In this case, it is conceivable that it is possible to supply a positive potential via the first portion P1 to the second portion P2 and the third portion P3 of the chip mounting part TAB1 without providing the leads (LD1A(P2) and LD1A(P3)) connected respectively to the second portion P2 and the third portion P3. Namely, from an electrical viewpoint of supplying a positive potential from the positive potential terminal PT to the first portion P1 to the third portion P3 of the chip mounting part TAB1, there is little need for providing the leads (LD1A(P2) and LD1A(P3)) connected respectively to the second portion P2 and the third portion P3. Accordingly, to corroborate this fact, for example, in the technique relating to the Patent Document 1 described in the section of "Background of the Invention", a lead is not connected to the components that correspond to the second portion P2 and the third portion P3 of the chip mounting part TAB1 in the first embodiment.

However, in this configuration, a heat dissipation path of heat generated from the semiconductor chip CHP1 and the semiconductor chip CHP2 which are mounted on the second portion P2 or the third portion P3 of the chip mounting part TAB1 is limited. Thus, the heat is likely to be accumulated near the periphery of the second portion P2 and the third portion P3 of the chip mounting part TAB1, and there is a risk of degrading the heat dissipation characteristic. The degradation in the heat dissipation characteristic leads to degradation in electrical characteristics of the semiconductor device in many cases. Namely, in the configuration in which the leads are not connected to the components that correspond to the second portion P2 and the third portion P3 of the chip mounting part TAB1 in the first embodiment, there is room for improvement from a viewpoint of enhancing the heat dissipation characteristic of the semiconductor device PKG1.

With respect to this, according to the first characteristic point in the first embodiment, as illustrated in FIGS. 9 and 10, the lead LD1A(P2) connected to the second portion P2 and the lead LD1A(P3) connected to the third portion P3 of the chip mounting part TAB1 are provided, and the lead LD1A(P2) and the lead LD1A(P3) respectively have the protruding portions that protrude from the sealing member MR. As a result, in the first embodiment, it is possible to efficiently dissipate the heat, which is generated from the semiconductor chip CHP1 and the semiconductor chip CHP2 which are mounted on the second portion P2 or the third portion P3 of the chip mounting part TAB1, through new heat dissipation paths via the lead LD1A(P2) connected directly to the second portion P2 and the lead LD1A(P3) connected directly to the third portion P3. Furthermore, since the lead LD1A(P2) and the lead LD1A(P3) respectively have the protruding portions that protrude from the side surface SD1 of the sealing member MR, it is possible to enhance the heat dissipation efficiency.

As described above, essentially, since the first portion P1 to the third portion P3 of the chip mounting part TAB1 are connected to each other in the integrated manner, there is not so much need for providing the leads connected respectively to the first portion P1 to the third portion P3 in a case where a focus is placed only on the viewpoint of supplying a positive potential.

However, the inventors of the present invention have found out that there is the risk of degrading the heat dissipation characteristic in this simplified configuration, and have reached the above-described first characteristic point in the first embodiment from the viewpoint of enhancing the heat dissipation characteristic. Namely, the first characteristic point in the first embodiment is a technical idea that is found by placing a focus not only on the viewpoint of supplying a positive potential to the first portion P1 to the third portion P3 of the chip mounting part TAB1 but also on the enhancement of the overall heat dissipation characteristic of the first portion P1 to the third portion P3 of the chip mounting part TAB1, and has the technical significance of efficiently dissipating the heat generated inside the semiconductor device PKG1.

In particular, according to the first characteristic point in the first embodiment, there are a first configuration in which the effective heat dissipation paths are newly provided by providing the leads (LD1A(P2) and LD1A(P3)) connected directly to the second portion P2 and the third portion P3 of the chip mounting part TAB1 and a second configuration in which the leads (LD1A(P2) and LD1A(P3)) themselves have the protruding portions that protrude from the sealing member MR. Therefore, according to the first embodiment, it is possible to promptly conduct the heat from the second portion P2 and the third portion P3 each having a heat generation source to the leads (LD1A(P2) and LD1A(P3)) which are the new heat dissipation paths with the first configuration, and further, it is possible to enhance the heat dissipation efficiency from the leads to the outside with the second configuration.

Therefore, it is possible to enhance the heat dissipation characteristic of the semiconductor device PKG1 according to the first characteristic point in the first embodiment. This means that it is possible to suppress the reduction in operation reliability of the semiconductor device due to the heat generation, and to put it another way, it is possible to enhance the operation reliability of the semiconductor device according to the first embodiment. In addition, from another viewpoint, since it is possible to increase drive current of a motor by enhancing the heat dissipation characteristic of the semiconductor device PKG1 constituting the inverter circuit according to the first embodiment, it is possible to enhance the performance of the semiconductor device PKG1.

Subsequently, a second characteristic point in the first embodiment is that the protruding portions of the leads LD1 (LD1A(P2) and LD1A(P3) in FIGS. 9 and 10) connected respectively to the second portion P2 and the third portion P3 of the chip mounting part TAB1 have the parts capable of being connected to the mounting substrate (wiring substrate) as illustrated in FIGS. 6 and 7 on the premise of the first characteristic point described above. For example, as illustrated in FIGS. 6 and 7, the lead LD1 connected to each of the second portion P2 and the third portion P3 is processed to have the gull-wing shape, and the distal end portion in the gull-wing shape serves as the part capable of being soldered with the mounting substrate. Namely, in FIGS. 6 and 7, the protruding portion of the lead LD1 connected to each of the second portion P2 and the third portion P3 has the part capable of being soldered with the mounting substrate as the part capable of being connected to the mounting substrate. As a result, according to the first embodiment, the lead LD1 connected to each of the second portion P2 and the third portion P3 is mounted on the mounting substrate by the part capable of being connected to the mounting substrate provided in each of the protruding portions. Accordingly, it is possible to efficiently dissipate the heat from the second portion P2 and the third portion P3 of the chip mounting part TAB1 each having the heat generation source further to the mounting substrate on which the leads LD1 are mounted via the lead LD1 connected to each of the second portion P2 and the third portion P3. Namely, according to the first embodiment, it is possible to achieve further enhancement of the heat dissipation characteristic by the second characteristic point in which the protruding portion of the lead LD1 connected to each of the second portion P2 and the third portion P3 is connected to the mounting substrate by the part capable of being connected to the mounting substrate in addition to the enhancement of the heat dissipation characteristic by the first characteristic point described above.

This is because, if the protruding portion of the lead LD1 connected to each of the second portion P2 and the third portion P3 is not connected to the mounting substrate but floats, a conduction path of the heat from the protruding portion is limited to a heat dissipation path into the air having a low thermal conductivity that is present around the protruding portion. Meanwhile, according to the second characteristic point in the first embodiment, it is possible to connect the protruding portion of the lead LD1 connected to each of the second portion P2 and the third portion P3 to a conductor pattern of the mounting substrate having a high thermal conductivity. Therefore, according to the second characteristic point in the first embodiment, it is possible to efficiently dissipate the heat from the second portion P2 and the third portion P3 of the chip mounting part TAB1 each having the heat generation source via the lead LD1 connected to each of the second portion P2 and the third portion P3 further to the conductor pattern having the high thermal conductivity on which the leads LD1 are mounted. Namely, in the semiconductor device PKG1 in the first embodiment, since the second characteristic point is provided in addition to the first characteristic point, it is possible to achieve the further enhancement of the heat dissipation characteristic of the semiconductor device PKG1. This point is a first advantage of the second characteristic point in the first embodiment, but since it is possible to further obtain a second advantage according to the second characteristic point in the first embodiment, the second advantage will be described below.

For example, in the technique relating to the Patent Document 1 described in the section of "Background of the Invention", the leads are not connected to the components that correspond to the second portion P2 and the third portion P3 of the chip mounting part TAB1 in the first embodiment. In this configuration, the number of leads that protrude from one side surface of the sealing member is smaller than the number of leads that protrude from the other side surface of the sealing member. More specifically, in the technique described in the Patent Document 1, the numbers of leads protruding from both side surfaces of the sealing member are different from each other, resulting in an asymmetric structure. In this structure, for example, when a temperature cycle test is performed to test reliability in connection between the semiconductor device and the mounting substrate after the semiconductor device is mounted on the mounting substrate, a large thermal stress is applied to some of the leads due to the asymmetric structure. As a result, a defect that a connection part between the semiconductor device and the mounting substrate is broken is likely to occur due to the large thermal stress applied to some of the leads. In other words, in the asymmetric structure in which the numbers of leads protruding from both side surfaces of the sealing member are different from each other, durability of the connection part between the semiconductor device and the mounting substrate decreases in many cases.

On the other hand, according to the combination of the first characteristic point and the second characteristic point in the first embodiment, for example, it is possible to mount the semiconductor device PKG1 to the mounting substrate with a symmetrical structure in which the number of the leads LD1 protruding from the side surface SD1 of the sealing member MR and the number of the control leads CLD protruding from the side surface SD2 of the sealing member MR are the same as illustrated in FIGS. 6 and 7. As a result, because of the symmetrical structure, it is possible to suppress a large thermal stress from being applied to some of the leads LD1 even if a temperature cycle test is performed to test the connection reliability between the semiconductor device PKG1 and the mounting substrate after the semiconductor device PKG1 is mounted on the mounting substrate. This means that it is possible to enhance the reliability of the connection part between the semiconductor device PKG1 and the mounting substrate. In other words, according to the symmetrical structure (structure in which the numbers of the leads protruding from both side surfaces are the same) obtained by combining the first characteristic point and the second characteristic point in the first embodiment, it is possible to enhance the durability of the connection part between the semiconductor device PKG1 and the mounting substrate. This point is the second advantage which is achieved by the second characteristic point in the first embodiment.

In particular, in the first embodiment, the length of each of the protruding portions of the lead LD1A(P1, PT) to the lead LD1B(W) (sixteen leads in total) protruding from the side surface SD1 of the sealing member MR is equal, and the length of each of the protruding portions of the plurality of control leads CLD (sixteen leads in total) protruding from the side surface SD2 of the sealing member MR is equal as illustrated in FIGS. 9 and 10. Further, the length of each of the protruding portions of the lead LD1A(P1, PT) to the lead LD1B(W) protruding from the side surface SD1 and the length of each of the protruding portions of the plurality of control leads CLD protruding from the side surface SD2 are equal to each other. Accordingly, the symmetry of the symmetrical structure in the first embodiment further increases, and it is thus possible to achieve further enhancement of the reliability of the connection part between the semiconductor device PKG1 and the mounting substrate.

Further, in the first embodiment, the width of each of the protruding portions of the lead LD1A(P1, PT) to the lead LD1B(W) in the x direction is equal, and the width of each of the protruding portions of the plurality of control leads CLD in the x direction is equal as illustrated in FIGS. 9 and 10. Also, the width of each of the protruding portions of the lead LD1A(P1, PT) to the lead LD1B(W) in the x direction and the width of each of the protruding portions of the plurality of control leads CLD in the x direction are equal to each other. In addition, the interval (pitch) between each of the protruding portions of the lead LD1A(P1, PT) to the lead LD1B(W) in the x direction is equal, and the interval (pitch) between each of the protruding portions of the plurality of control leads CLD in the x direction is equal. Accordingly, the symmetry of the symmetrical structure in the first embodiment further increases, and it is thus possible to achieve further enhancement of the reliability of the connection part between the semiconductor device PKG1 and the mounting substrate.

Note that, according to the second characteristic point in the first embodiment, it has been confirmed that it is possible to enhance the reliability in the solder mounting of the semiconductor device PKG1 on the mounting substrate about 2.5 times as compared with the related art (configuration of the Patent Document 1) as a result of simulation. Accordingly, it can be understood that it is possible to enhance the reliability in the solder mounting also in a quantitative manner in the first embodiment.

Next, a third characteristic point in the first embodiment will be described. The third characteristic point in the first embodiment is based on, for example, a basic idea that a heat capacity of the lead LD1 which is connected to each of the second portion P2 and the third portion P3 of the chip mounting part TAB1 is increased in order to suppress a temperature rise due to the heat generation of the semiconductor device PKG1. Namely, it is conceivable that, when the heat capacity of the lead LD1 which is connected to each of the second portion P2 and the third portion P3 of the chip mounting part TAB1 is increased, the temperature rise is less likely to occur even if the heat generation amount increases, so that it is possible to suppress the temperature rise of the entire semiconductor device PKG1. In particular, the semiconductor chip CHP1 and the semiconductor chip CHP2 which generate heat are mounted on each of the second portion P2 and the third portion P3 of the chip mounting part TAB1, and it is conceivable that it is possible to effectively suppress the temperature rise of the semiconductor device PKG1 by increasing the heat capacity of the lead LD1 connected to each of the second portion P2 and the third portion P3. Further, in the first embodiment, the above-described basic idea is applied not only to the lead LD1 connected to each of the second portion P2 and the third portion P3 of the chip mounting part TAB1, but also to the lead LD1 connected to each of the chip mounting part TAB2 to the chip mounting part TAB4 on which the semiconductor chip CHP1 and the semiconductor chip CHP2 which generate heat are mounted. Meanwhile, as illustrated in FIGS. 9 and 10, the leads LD1 (LD1(NT1), LD1(NT2) and LD1(NT3)), which are not connected to the chip mounting part TAB1 to the chip mounting part TAB4 on which the semiconductor chip CHP1 and the semiconductor chip CHP2 which generate heat are mounted, are provided in the semiconductor device PKG1 in the first embodiment. It is conceivable that there is little need for increasing the heat capacity of these leads LD1 because these leads LD1 are not in direct contact with the heat source including the semiconductor chip CHP1 and the semiconductor chip CHP2. From the foregoing, if the above-described basic idea is described in consideration of a magnitude relationship with a comparison object, it can be said that the above-described basic idea sets the heat capacity of the lead LD1, which is connected to each of the chip mounting part TAB1 to the chip mounting part TAB4, to be larger than the heat capacity of the lead LD1, which is not connected to each of the chip mounting part TAB1 to the chip mounting part TAB4. Further, a configuration example that has embodied this basic idea is the third characteristic point in the first embodiment. Hereinafter, this third characteristic point will be described.

For example, when placing a focus on the second portion P2 of the chip mounting part TAB1 in FIGS. 9 and 10, the third characteristic point in the first embodiment is to include the two leads (lead LD1A(P2) and lead LD1B(P2)), which are spaced apart from each other and connected to the second portion P2 of the chip mounting part TAB1. Namely, the third characteristic point in the first embodiment is that the lead connected to the second portion P2 of the chip mounting part TAB1 is configured of the two leads LD1 (LD1A(P2) and lead LD1B(P2)) which are spaced apart from each other instead of one lead LD1. Further, this configuration can be realized by, for example, the configuration in which the protruding portion of the lead LD1A(P2) is arranged between the lead LD1(NT1) and the lead LD1B(P2) when seen in a plan view as illustrated in FIGS. 9 and 10.

Accordingly, in the first embodiment, it is possible to increase the heat capacity of the lead connected to the second portion P2 of the chip mounting part TAB1. This is because the entire heat capacity obtained by combining a heat capacity of the lead LD1A(P2) and a heat capacity of the lead LD1B(P2) can be set as the heat capacity of the lead connected to the second portion P2 of the chip mounting part TAB1 according to the third characteristic point in the first embodiment. As a result, according to the third characteristic point in the first embodiment, it is possible to increase the combined heat capacity of the lead LD1A(P2) and the lead LD1B(P2) connected to the second portion P2 of the chip mounting part TAB1 having the heat source, and it is thus possible to suppress the temperature rise due to the heat generated from the heat source.

Note that, although the focus is particularly placed on the second portion P2 of the chip mounting part TAB1 in the description here, this configuration can be applied also to the lead connected to each of the first portion P1 and the third portion P3 of the chip mounting part TAB1 and the chip mounting part TAB2 to the chip mounting part TAB4, and is actually applied to these leads in the first embodiment. Therefore, according to the third characteristic point in the first embodiment, it is possible to increase the heat capacity of the lead directly connected to the heat source, and it is thus possible to suppress the temperature rise of the semiconductor device PKG1 even if the amount of heat generated from the heat source increases. As a result, according to the third characteristic point in the first embodiment, it is possible to enhance the operation reliability of the semiconductor device PKG1.

Further, it is possible to obtain the following advantage according to the third characteristic point in the first embodiment to include the two leads of the lead LD1A(P2) and the lead LD1B(P2), which are spaced apart from each other and connected to the second portion P2 of the chip mounting part TAB1. Namely, according to the third characteristic point in the first embodiment, in addition to being able to increase the heat capacity, it is possible to achieve the enhancement of the heat dissipation efficiency because the surface region of each of the two leads LD1 (lead LD1A(P2) and lead LD1B(P2)) can be used as a heat dissipation region. Specifically, the third characteristic point in the first embodiment contributes not only to the suppression of the temperature rise of the semiconductor device PKG1 by increasing the heat capacity, but also to the enhancement of the heat dissipation efficiency by increasing the surface area of the lead LD1 serving as the heat dissipation region.

Subsequently, a fourth characteristic point in the first embodiment will be described. The fourth characteristic point in the first embodiment is that the semiconductor chips (semiconductor chip CHP1, semiconductor chip CHP2 and semiconductor chip CHP3) are mounted on the rear surface of each of the first portion P1 to the third portion P3 of the chip mounting part TAB1 and the chip mounting part TAB2 to the chip mounting part TAB5 as illustrated in FIG. 10. For example, the semiconductor chip CHP1 and the semiconductor chip CHP2 are mounted on the rear surface of the chip mounting part TAB1 and the semiconductor chip CHP3 is mounted on the rear surface of the chip mounting part TAB5 as illustrated in FIG. 8.

Therefore, according to the fourth characteristic point in the first embodiment, it is possible to decrease the thickness of the sealing member MR that covers the front surface side (upper surface side) of the chip mounting part TAB1 as illustrated in FIG. 8. This means that it is possible to decrease the thickness of the entire sealing member MR, and it is thus possible to achieve the thickness reduction of the semiconductor device PKG1.

Further, according to the fourth characteristic point in the first embodiment, since it is possible to decrease the thickness of the sealing member MR that covers the front surface side (upper surface side) of the chip mounting part TAB1, the heat generated from the semiconductor chip CHP1 to the semiconductor chip CHP3 which are present inside the sealing member MR can be efficiently conducted to a heat sink in the case where the heat sink is provided on the upper surface of the sealing member MR. As a result, in the first embodiment, it is possible to achieve the enhancement of the heat dissipation characteristic of the semiconductor device PKG1 by the synergy between the point of providing the heat sink and the point of being able to efficiently conduct the heat to the heat sink. Note that, according to the fourth characteristic point in the first embodiment, even in the case where the heat sink is not provided, since the semiconductor chip is not mounted on the front surface side of the chip mounting part TAB1, it is possible to expose the chip mounting part from the upper surface of the sealing member MR, and it is thus possible to achieve the enhancement of the heat dissipation characteristic of the semiconductor device PKG1.

In addition, according to the fourth characteristic point in the first embodiment, it is possible to achieve the thickness reduction of the sealing member MR, and it is thus possible to reduce the amount of resin used to form the sealing member MR. This means that it is possible to achieve the reduction in weight of the semiconductor device PKG1, and further, it is possible to achieve the cost reduction of the semiconductor device PKG1 resulting from the reduction in the amount of resin to be used.

From the foregoing, it can be said that the technical idea in the first embodiment including the first characteristic point to the fourth characteristic point described above is excellent in terms of being able to provide the high-performance semiconductor device PKG1 at low cost.

<Mounting Mode to Mounting Substrate>

Figure 11A:
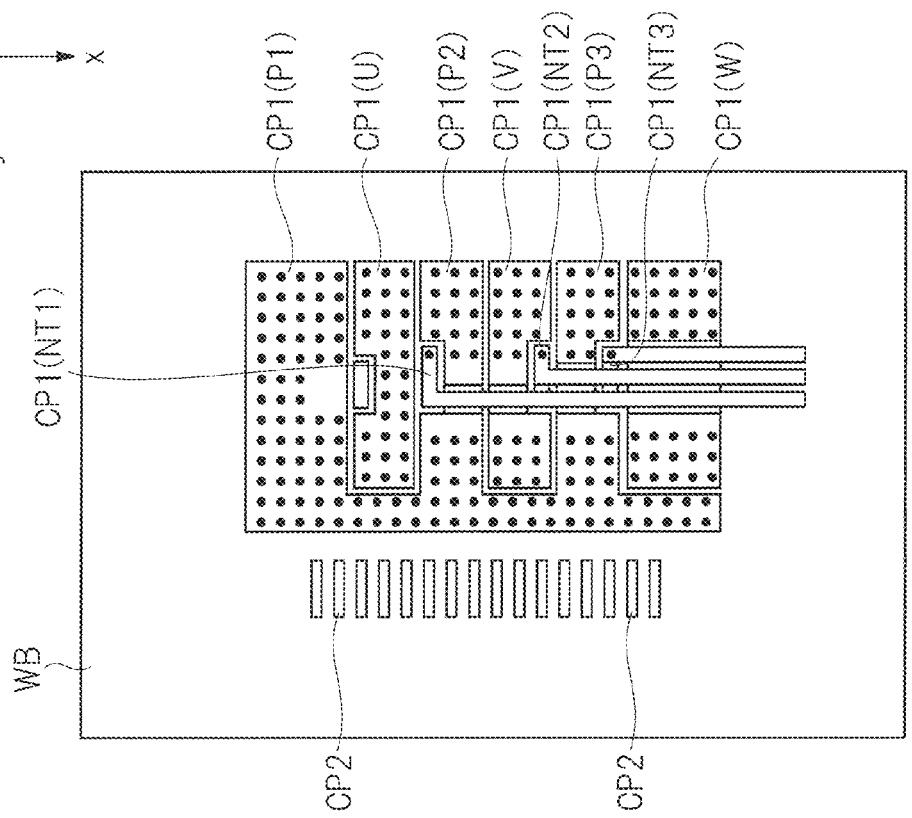
FIG. 11A is a plan view illustrating an upper surface of a mounting substrate.
Figure 11B:
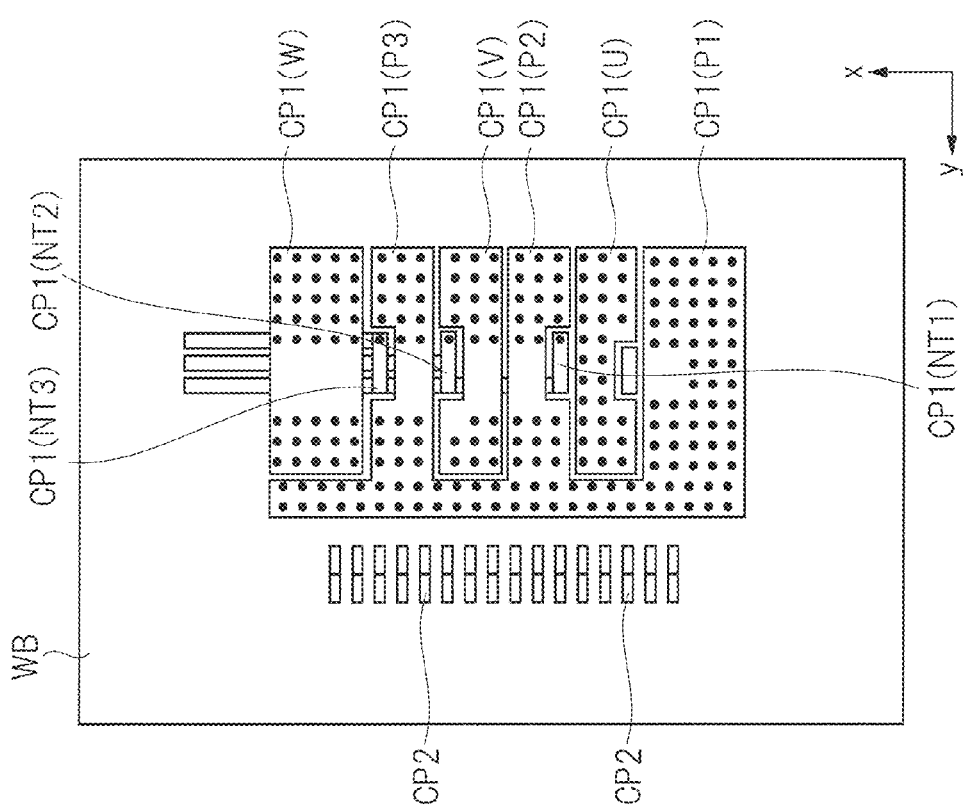
FIG. 11B is a plan view illustrating a lower surface of the mounting substrate.

Next, a configuration example of mounting the semiconductor device PKG1 in the first embodiment to the mounting substrate will be described. FIGS. 11A and 11B are diagrams illustrating a layout configuration of the mounting substrate on which the semiconductor device PKG1 in the first embodiment is mounted. Specifically, FIG. 11A is a plan view illustrating an upper surface of the mounting substrate, and FIG. 11B is a plan view illustrating a lower surface of the mounting substrate.

First, as illustrated in FIGS. 11A and 11B, the mounting substrate (wiring substrate) WB in the first embodiment has a rectangular shape and has a plurality of the conductor patterns formed thereon. Specifically, a conductor pattern CP1(P1) to a conductor pattern CP1(P3) are formed on the upper surface and the lower surface of the mounting substrate WB so as to be arranged in the x direction and connected to each other in an integrated manner. Further, the conductor pattern CP1(P1) to the conductor pattern CP1(P3) formed on the upper surface and the conductor pattern CP1(P1) to the conductor pattern CP1(P3) formed on the lower surface are electrically connected with each other through vias (plugs).

Further, as illustrated in FIGS. 11A and 11B, a conductor pattern CP1(U) is formed so as to be spaced apart from and sandwiched between the conductor pattern CP1(P1) and the conductor pattern CP1(P2) and a conductor pattern CP1(V) is formed so as to be spaced apart from and sandwiched between the conductor pattern CP1(P2) and the conductor pattern CP1(P3) when seen in a plan view. In addition, a conductor pattern CP1(W) is formed so as to sandwich the conductor pattern CP1(P3) between the conductor pattern CP1(V) and the conductor pattern CP1(W) when seen in a plan view.

Further, a cutout is formed in a part of the conductor pattern CP1(P2), and a conductor pattern CP1(NT1) is formed in this cutout. Similarly, a cutout is formed also in a part of the conductor pattern CP1(V), and a conductor pattern CP1(NT2) is formed in this cutout. In addition, a cutout is formed also in a part of the conductor pattern CP1(P3), and a conductor pattern CP1(NT3) is formed in this cutout. Further, a plurality of conductor patterns CP2 are also formed on the mounting substrate WB so as to be spaced apart from each other in the y direction. In the above-described manner, the plurality of conductor patterns are formed on the mounting substrate WB in the first embodiment.

Figure 12:
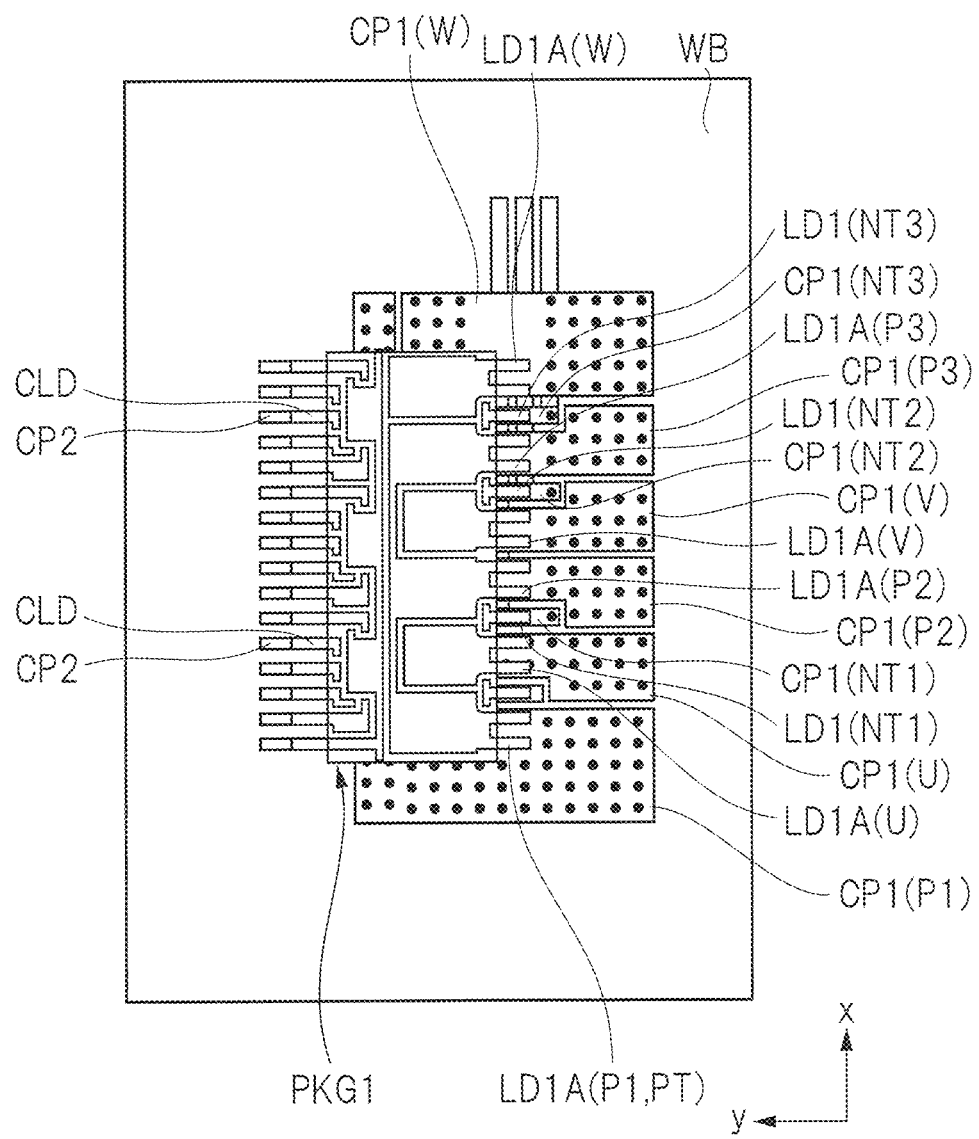
FIG. 12 is a plan view illustrating a state in which the semiconductor device in the first embodiment is mounted on the upper surface of the mounting substrate in the first embodiment.

Subsequently, FIG. 12 is a plan view illustrating a state in which the semiconductor device PKG1 in the first embodiment is mounted on the upper surface of the mounting substrate WB in the first embodiment. As illustrated in FIG. 12, the lead LD1A(P1, PT) is connected to the conductor pattern CP1(P1), the lead LD1A(P2) is connected to the conductor pattern CP1(P2), and the lead LD1A(P3) is connected to the conductor pattern CP1(P3). Further, the lead LD1A(U) is connected to the conductor pattern CP1(U), the lead LD1A(V) is connected to the conductor pattern CP1(V), and the lead LD1A(W) is connected to the conductor pattern CP1(W). Further, the lead LD1(NT1) is connected to the conductor pattern CP1(NT1), the lead LD1(NT2) is connected to the conductor pattern CP1(NT2), and the lead LD1(NT3) is connected to the conductor pattern CP1(NT3). In addition, the control lead CLD is connected to the conductor pattern CP2. In this manner, the semiconductor device PKG1 is mounted on the upper surface of the mounting substrate WB.

Here, in the first embodiment, the conductor pattern CP1(P1) to the conductor pattern CP1(P3) are connected to each other in the integrated manner as illustrated in FIGS. 11A and 11B. Further, the conductor pattern CP1(P1) to the conductor pattern CP1(P3) formed on the upper surface of the mounting substrate WB and the conductor pattern CP1(P1) to the conductor pattern CP1(P3) formed on the lower surface of the mounting substrate WB are connected to each other through the plugs. Thus, in the first embodiment, it is possible to increase a heat capacity of the conductor pattern (integrated pattern of the conductor pattern CP1(P1) to the conductor pattern CP1(P3)) connected to the leads LD1A (P1, NT) to LD1B(P3) which are connected to each of the first portion P1 to the third portion P3 of the chip mounting part TAB1 illustrated in FIG. 10, and further, it is possible to increase the surface area of the conductor pattern. This means that it is possible to efficiently conduct the heat generated in the semiconductor device PKG1 to the conductor pattern formed on the mounting substrate WB and it is also possible to suppress a temperature rise of the mounting substrate WB. As a result, in the first embodiment, it is possible to further enhance the operation reliability of the semiconductor device PKG1 by the synergy between the above-described devised points (first characteristic point to fourth characteristic point) in the semiconductor device PKG1 and the devised point relating to the layout of the conductor patterns in the mounting substrate WB.

Furthermore, the conductor pattern CP1(P1) to the conductor pattern CP1(P3) are electrically connected with each other in the mounting substrate WB in the first embodiment as illustrated in FIGS. 11A and 11B. Here, a power supply potential (positive potential) is supplied to the semiconductor device PKG1 via, for example, the mounting substrate WB. In consideration of this fact, the power supply potential can be supplied from the lead LD1A(P1, PT) to the first portion P1 of the chip mounting part TAB1, the power supply potential can be supplied from the lead LD1A(P2) to the second portion P2 of the chip mounting part TAB1, and the power supply potential can be supplied from the lead LD1A(P3) to the third portion P3 of the chip mounting part TAB1 in FIGS. 9 and 10.

Accordingly, in the first embodiment, the lead LD1A(P2) and the lead LD1A(P3) are provided from the main viewpoint of enhancing the heat dissipation characteristic from the second portion P2 and the third portion P3 having the heat generation source. In this configuration, it is possible to supply the power supply potential to the second portion P2 via the lead LD1A(P2) and supply the power supply potential to the third portion P3 via the lead LD1A(P3) by using the above-described mounting substrate WB. This means that it becomes unnecessary to supply the power supply potential to the second portion P2 and the third portion P3 via the first portion P1, and it is thus possible to shorten a path to supply the power supply potential to the second portion P2 and the third portion P3. Therefore, it is possible to reduce a parasitic resistance of the path to supply the power supply potential to the second portion P2 and the third portion P3, and as a result, it is possible to suppress a power drop of the power supply potential to be supplied to the second portion P2 and the third portion P3 in the first embodiment. In particular, in the semiconductor device PKG1 in the first embodiment, since the heat dissipation characteristic can be enhanced, it is possible to increase the drive current of the motor, but in this case, the current flowing in the inverter circuit is also increased. Accordingly, it is conceivable that the power drop caused by the parasitic resistance also increases when the current increases. However, in the first embodiment, since it is possible to reduce the parasitic resistance of the supply path of the power supply potential, it is possible to decrease the influence of the power drop even when the amount of current is increased. Consequently, according to the semiconductor device PKG1 in the first embodiment, it is possible to achieve the enhancement of the heat dissipation characteristic, and further, it is possible to suppress the degradation in the electrical characteristics of the semiconductor device PKG1 even when the drive current of the motor is increased along with the enhancement of the heat dissipation characteristic. From the foregoing, it can be said that the technical idea in the first embodiment is excellent in terms of being able to enhance the reliability and the electrical characteristics of the semiconductor device PKG1.

Note that, when the respective heat dissipation characteristics of the semiconductor device PKG1 in the first embodiment and the related art (for example, configuration corresponding to the Patent Document 1) are compared by the heat-transfer analysis of a finite element method, it has been confirmed that the semiconductor device PKG1 in the first embodiment can enhance the heat dissipation characteristic by about 8.3% as compared with the related art. Thus, it is corroborated that the semiconductor device PKG1 in the first embodiment has an advantage with respect to the related art from the viewpoint of the heat dissipation property. Namely, the effectiveness of the semiconductor device PKG1 in the first embodiment is confirmed not only in a qualitative manner but also in a quantitative manner.

Modified Example

Figure 13:
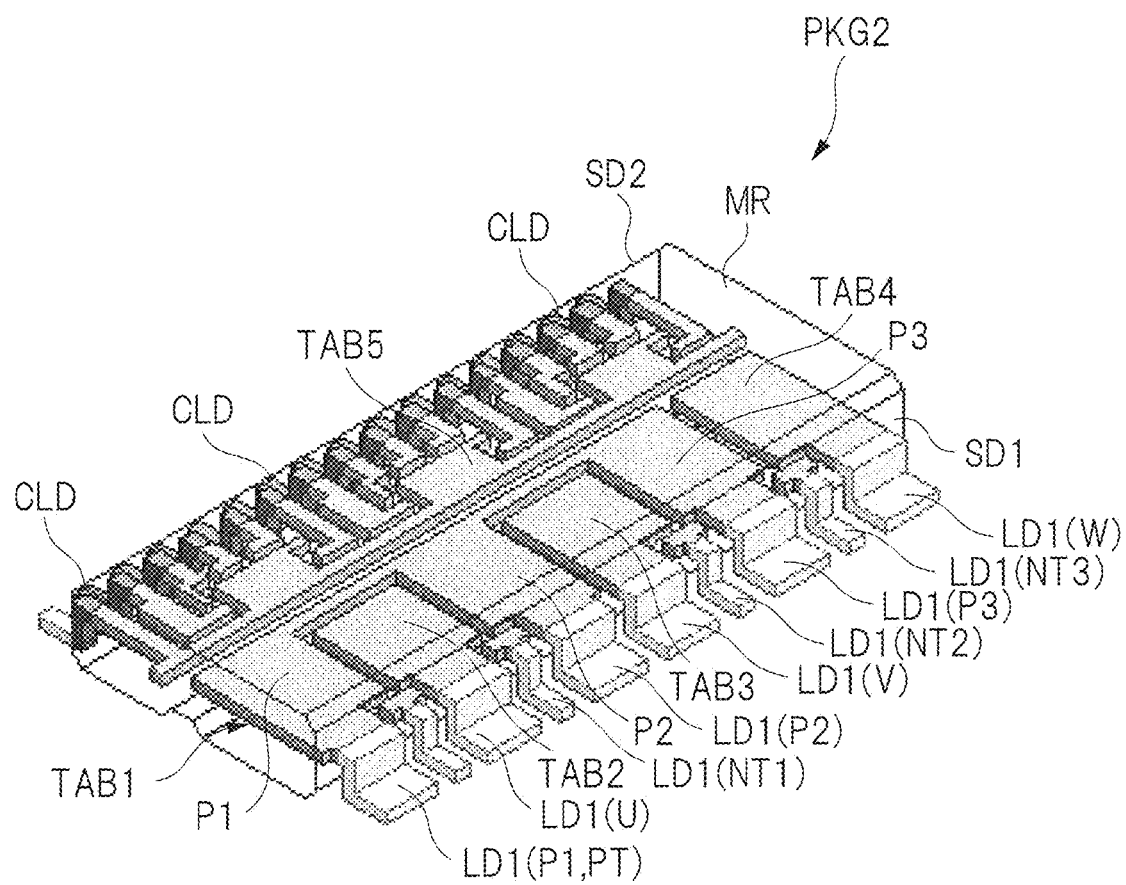
FIG. 13 is a perspective view illustrating a semiconductor device in a modified example which is viewed from an upper surface side of a sealing member.

Next, a modified example in the first embodiment will be described. The modified example is a configuration example in which the basic idea of increasing the heat capacity embodied as the third characteristic point described above is embodied with another configuration. FIG. 13 is a diagram illustrating an external configuration of a semiconductor device PKG2 in this modified example. The semiconductor device PKG2 in the modified example has the sealing member MR made of, for example, resin, and FIG. 13 illustrates an internal configuration of the semiconductor device PKG2 which is viewed through the sealing member MR. FIG. 13 corresponds to a perspective view of the semiconductor device PKG2 in the modified example which is viewed from the upper surface side of the sealing member MR. Meanwhile, FIG. 14 corresponds to a perspective view of the semiconductor device PKG2 in the modified example which is viewed from the lower surface side of the sealing member MR.

Figure 14:
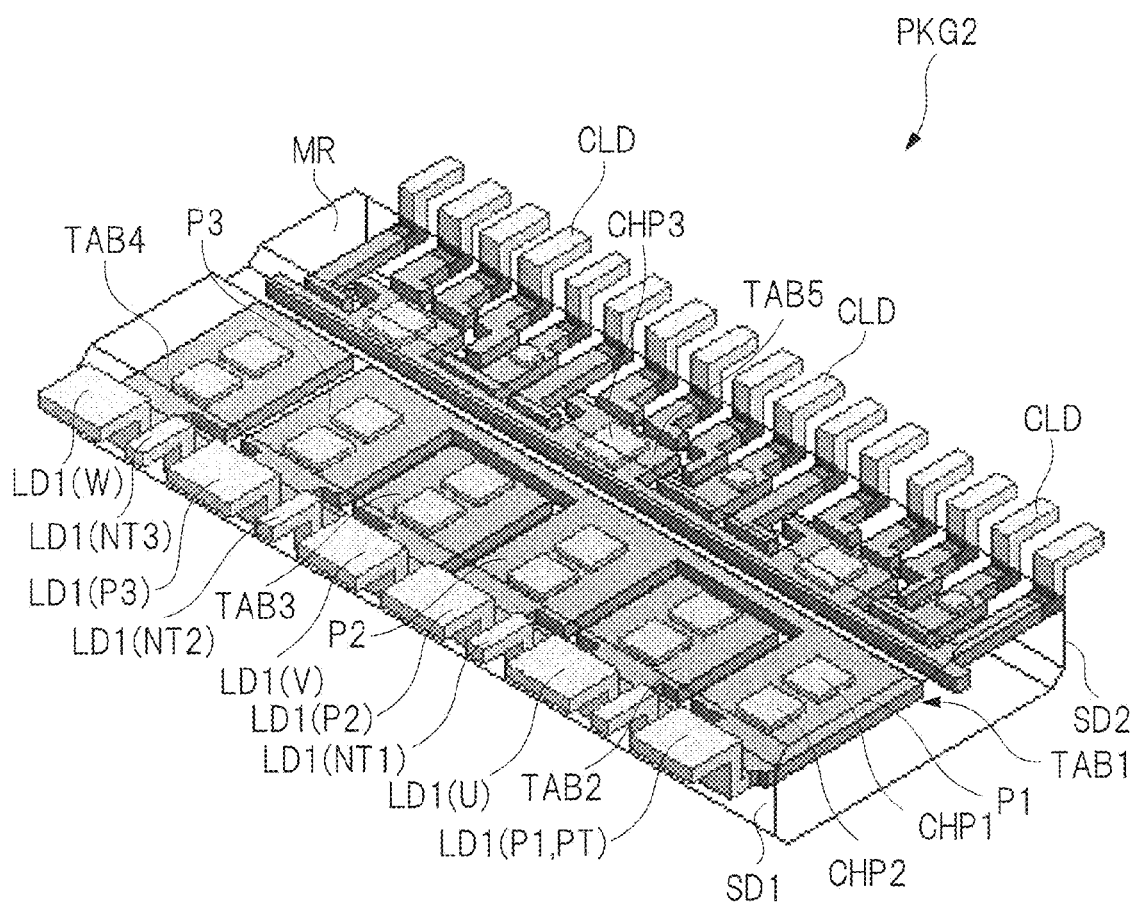
FIG. 14 is a perspective view illustrating the semiconductor device in the modified example which is viewed from a lower surface side of the sealing member.

As illustrated in FIGS. 13 and 14, a characteristic point in the modified example is that the width in the x direction of each of the leads (LD1(P1, PT), LD1(P2) and LD1(P3)) which is connected to the first portion P1 to the third portion P3 of the chip mounting part TAB1 is made larger than the width in the x direction of each of the leads (LD1(NT1), LD1(NT2) and LD1(NT3)) which is not connected to any chip mounting part. In this manner, it is possible to increase the heat capacity of the leads (LD1(P1, PT), LD1(P2) and LD1(P3)), and further, it is also possible to increase the heat dissipation area (surface area) by the lead configuration in the modified example.

Similarly, in the modified example, the width in the x direction of each of leads (LD1(U), LD1(V) and LD1(W)) which is connected to the chip mounting part TAB2 to the chip mounting part TAB4 is also made larger than the width in the x direction of each of the leads (LD1(NT1), LD1(NT2) and LD1(NT3)) which is not connected to any chip mounting part as illustrated in FIGS. 13 and 14. In this manner, it is possible to increase the heat capacity of the leads (LD1(U), LD1(V) and LD1(W)), and further, it is also possible to increase the heat dissipation area (surface area) by the lead configuration in the modified example.

From the foregoing, like the third characteristic point in the first embodiment, it is possible to suppress the temperature rise of the semiconductor device PKG2 by increasing the heat capacity of the lead, and further, it is possible to achieve the enhancement of a heat dissipation efficiency by increasing the surface area of the lead serving as the heat dissipation area also by the modified example.

Second Embodiment

DIP Structure

Figure 15:
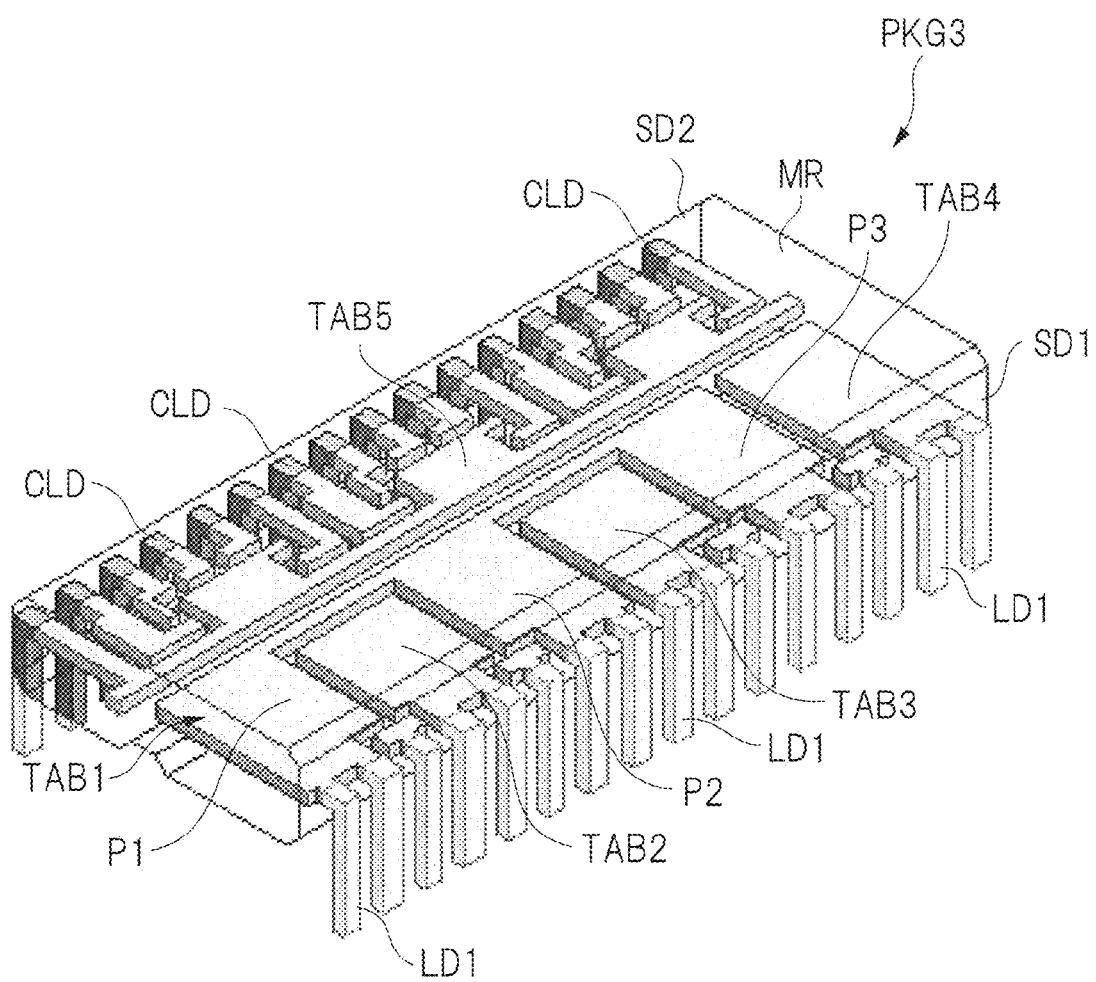
FIG. 15 is a perspective view illustrating a semiconductor device in a second embodiment which is viewed from an upper surface side of a sealing member.

Subsequently, a semiconductor device in a second embodiment will be described. FIG. 15 is a diagram illustrating an external configuration of a semiconductor device PKG3 in the second embodiment. The semiconductor device PKG3 in the second embodiment has the sealing member MR made of, for example, resin, and FIG. 15 illustrates an internal configuration of the semiconductor device PKG3 which is viewed through the sealing member MR. FIG. 15 corresponds to a perspective view of the semiconductor device PKG3 in the second embodiment which is viewed from the upper surface side of the sealing member MR. Meanwhile, FIG. 16 corresponds to a perspective view of the semiconductor device PKG3 in the second embodiment which is viewed from the lower surface side of the sealing member MR.

Figure 16:
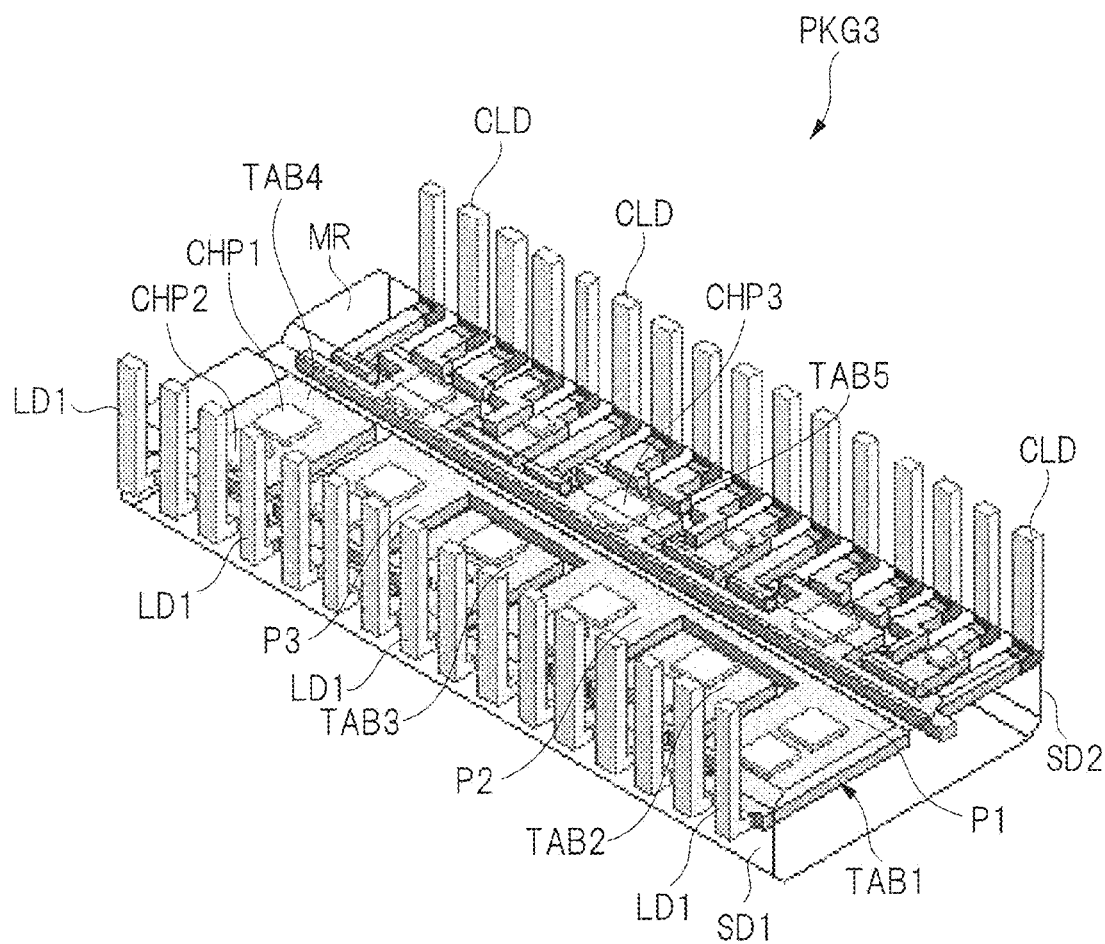
FIG. 16 is a perspective view illustrating the semiconductor device in the second embodiment which is viewed from a lower surface side of the sealing member.

As illustrated in FIGS. 15 and 16, in the second embodiment, the lead LD1 has a protruding portion that protrudes from the side surface SD1 of the sealing member MR, and the protruding portion of the lead LD1 is configured to include a part capable of being connected to the mounting substrate so as to mount the semiconductor device PKG3 to the mounting substrate. Specifically, in the second embodiment, as illustrated in FIGS. 15 and 16, the lead LD1 is bent in the z direction and the portion bent in the z direction forms a part capable of being inserted into the mounting substrate. Namely, in the semiconductor device PKG3 in the second embodiment illustrated in FIGS. 15 and 16, the protruding portion of the lead LD1 has the part capable of being inserted into the mounting substrate as the part capable of being connected to the mounting substrate. Note that, although the configuration of the lead LD1 has been described here, the control lead CLD that protrudes from the side surface SD2 of the sealing member MR also has a protruding portion bent in the z direction, and the protruding portion forms a part capable of being inserted into the mounting substrate. In the above-described manner, the semiconductor device PKG3 in the second embodiment is configured and mounted.

According to the second embodiment, the semiconductor device PKG3 can be mounted on the mounting substrate by inserting the lead LD1 and the control lead CLD into the mounting substrate. At this time, the lead LD1 and the control lead CLD inserted into the mounting substrate are brought into direct contact not only with the conductor pattern (wiring pattern) formed on the front surface of the mounting substrate, but also with the conductor pattern formed on the rear surface of the mounting substrate. Thus, in the semiconductor device PKG3 in the second embodiment, it is possible to enhance a heat dissipation characteristic from the lead LD1 to the mounting substrate. Specifically, when the respective heat dissipation characteristics of the semiconductor device PKG3 in the second embodiment and the related art (for example, the configuration corresponding to the Patent Document 1) are compared by the heat-transfer analysis of the finite element method, it has been confirmed that the semiconductor device PKG3 in the second embodiment can enhance the heat dissipation characteristic by about 9.9% as compared with the related art.

From the foregoing, it is corroborated that the semiconductor device PKG3 in the second embodiment has an advantage with respect to the related art from the viewpoint of the heat dissipation property. Namely, the effectiveness of the semiconductor device PKG3 in the second embodiment is confirmed not only in a qualitative manner but also in a quantitative manner.

Third Embodiment

SOP Structure+DIP Structure

Figure 17:
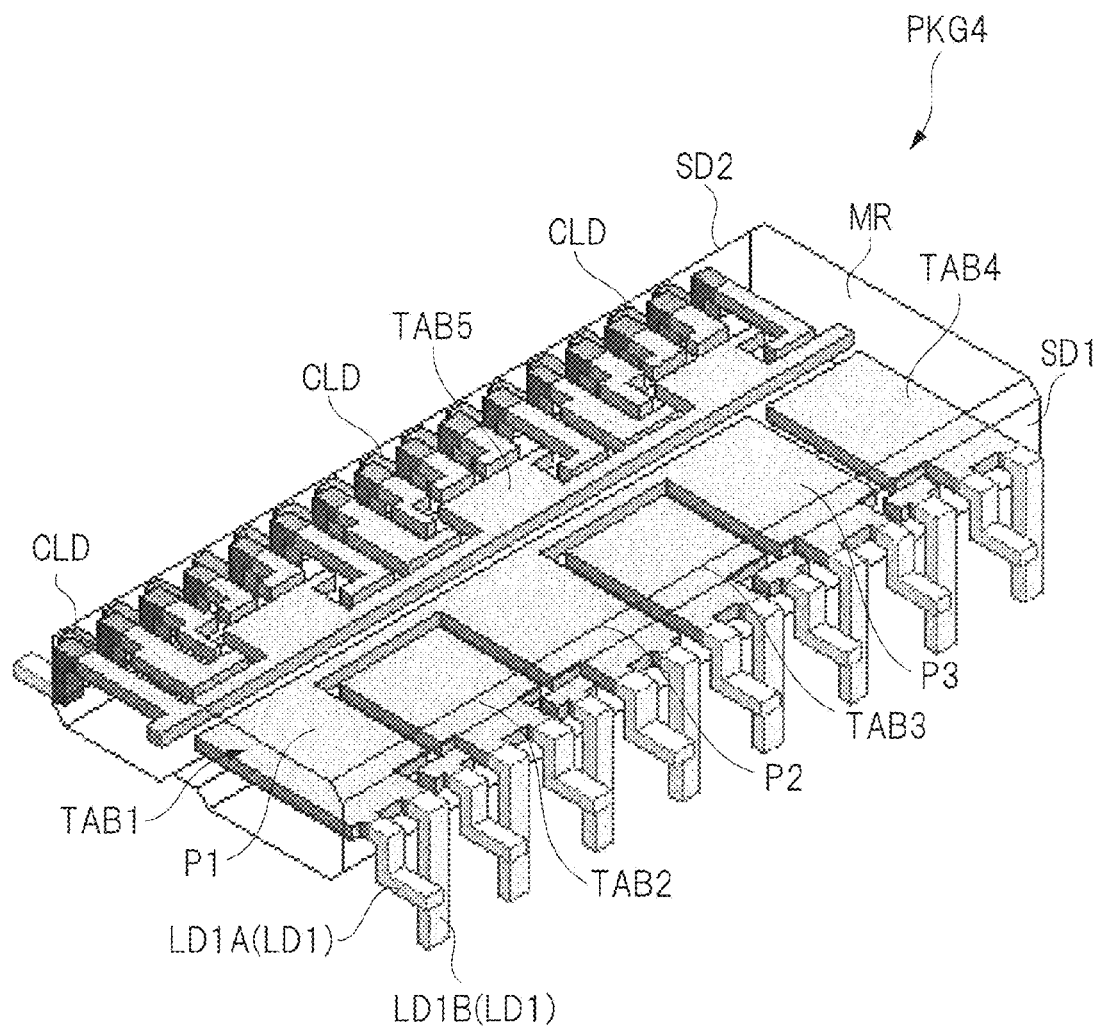
FIG. 17 is a perspective view illustrating a semiconductor device in a third embodiment which is viewed from an upper surface of a sealing member.

Next, a semiconductor device in a third embodiment will be described. FIG. 17 is a diagram illustrating an external configuration of a semiconductor device PKG4 in the third embodiment. The semiconductor device PKG4 in the third embodiment has the sealing member MR made of, for example, resin, and FIG. 17 illustrates an internal configuration of the semiconductor device PKG4 which is viewed through the sealing member MR. FIG. 17 corresponds to a perspective view of the semiconductor device PKG4 in the third embodiment which is viewed from the upper surface side of the sealing member MR. Meanwhile, FIG. 18 corresponds to a perspective view of the semiconductor device PKG4 in the third embodiment which is viewed from the lower surface side of the sealing member MR.

Figure 18:
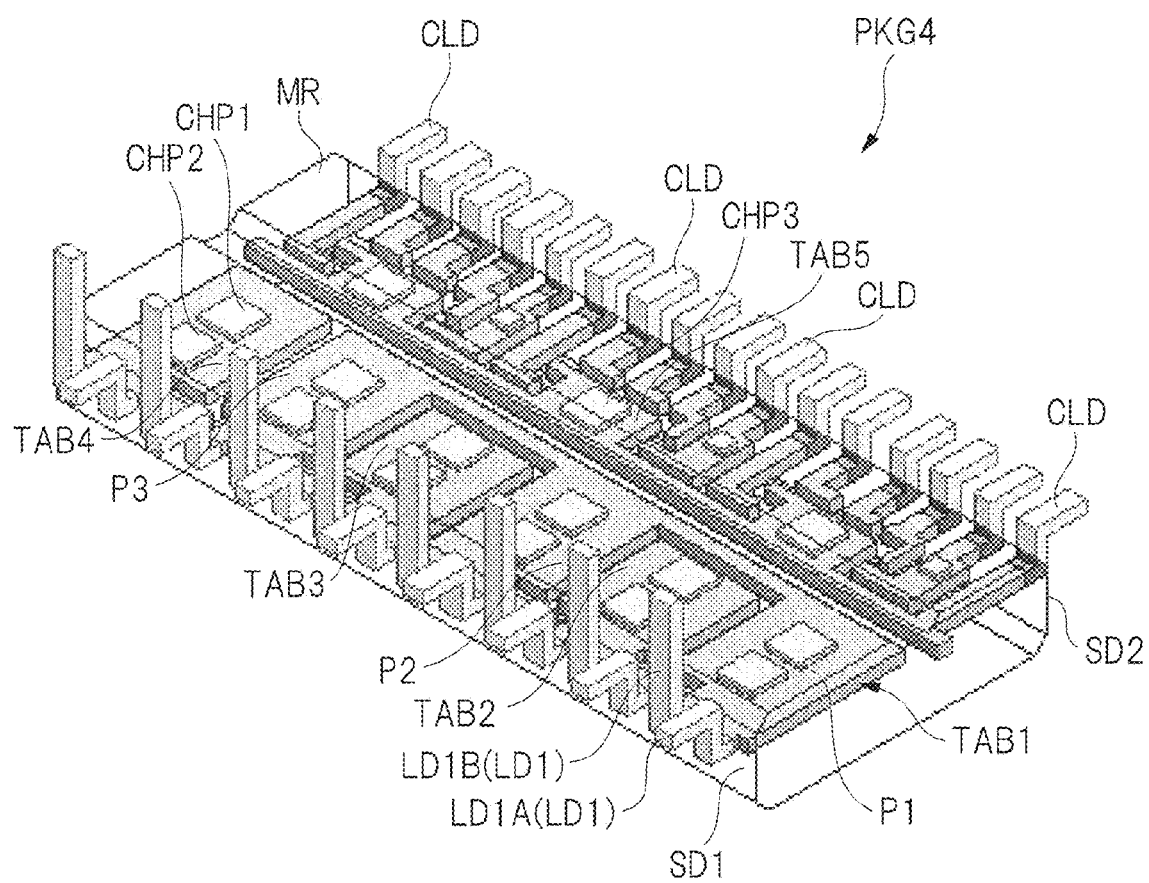
FIG. 18 is a perspective view illustrating the semiconductor device in the third embodiment which is viewed from a lower surface side of the sealing member.
Figure 18:
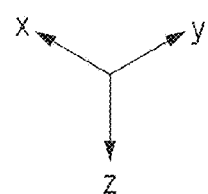

As illustrated in FIGS. 17 and 18, in the third embodiment, each of the lead LD1A and the lead LD1B has a protruding portion that protrudes from the side surface SD1 of the sealing member MR, and the protruding portion of the lead LD1A and the protruding portion of the lead LD1B are configured to include a part capable of being connected to the mounting substrate in order to mount the semiconductor device PKG4 to the mounting substrate. Specifically, in the third embodiment, the lead LD1A is processed to have a gull-wing shape and a distal end portion of the gull-wing shape forms a part capable of being soldered with the mounting substrate as illustrated in FIGS. 17 and 18. Namely, in the semiconductor device PKG4 in the third embodiment illustrated in FIGS. 17 and 18, the protruding portion of the lead LD1A has the part capable of being soldered with the mounting substrate as the part capable of being connected to the mounting substrate. Meanwhile, the lead LD1B is bent in the z direction, and the portion bent in the z direction forms a part capable of being inserted into the mounting substrate. Namely, in the semiconductor device PKG4 in the third embodiment illustrated in FIGS. 17 and 18, the protruding portion of the lead LD1B has the part capable of being inserted into the mounting substrate as the part capable of being connected to the mounting substrate. As described above, the semiconductor device PKG4 in the third embodiment has the lead LD1A and the lead LD1B that protrude from the side surface SD1 of the sealing member MR, and the part of the lead LD1A capable of being connected to the mounting substrate and the part of the lead LD1B capable of being connected to the mounting substrate have different shapes. Note that, although the configuration of the lead LD1A and the lead LD1B has been described here, the control leads CLD protruding from the side surface SD2 of the sealing member MR are all processed to have a gull-wing shape, and a distal end portion of the gull-wing shape forms a part capable of being soldered with the mounting substrate. In the above-described manner, the semiconductor device PKG4 in the third embodiment is configured and mounted.

When the respective heat dissipation characteristics of the semiconductor device PKG4 in the third embodiment and the related art (for example, the configuration corresponding to the Patent Document 1) are compared by the heat-transfer analysis of the finite element method, it has been confirmed that the semiconductor device PKG4 in the third embodiment can enhance the heat dissipation characteristic by about 9.6% as compared with the related art.

From the foregoing, it is corroborated that the semiconductor device PKG4 in the third embodiment has an advantage with respect to the related art from the viewpoint of the heat dissipation property. Namely, the effectiveness of the semiconductor device PKG4 in the third embodiment is confirmed not only in a qualitative manner but also in a quantitative manner.

In the foregoing, the invention made by the inventors of the present invention has been concretely described based on the embodiments. However, it is needless to say that the present invention is not limited to the foregoing embodiments and various modifications and alterations can be made within the scope of the present invention.

Modified Example 1

In the embodiments described above, the configuration in which the semiconductor chip is mounted on the rear surface of the chip mounting part has been described. However, the technical idea according to the embodiments is not limited thereto, and can be applied also to a configuration in which the semiconductor chip is mounted on the front surface of the chip mounting part.

Modified Example 2

In the embodiments described above, the example in which the IGBT is used as the power transistor that functions as the switching element of the inverter circuit has been described. However, the technical idea according to the embodiments is not limited thereto, and a power MOSFET can be used instead of the IGBT. In this case, in a semiconductor chip in which the power MOSFET is formed, a rear surface electrode of the semiconductor chip functions as a drain, and a front surface electrode (front surface electrode pad) of the semiconductor chip functions as a source. Furthermore, a gate electrode (gate electrode pad) is formed on a front surface of the semiconductor chip in addition to the front surface electrode.

Note that, in the case where the power MOSFET is used as the switching element of the inverter circuit, it is unnecessary to provide the free wheel diode to be connected in antiparallel with the power MOSFET. This is because a body diode made up of a pn junction diode is formed between the epitaxial layer (drift layer or n type semiconductor region) and a body region (p type semiconductor region) in a device structure of the power MOSFET and this body diode has a function as the free wheel diode.

What is claimed is:

1. A semiconductor device comprising:
a first chip mounting part including a first portion and a second portion;
a second chip mounting part;
a third chip mounting part;
a first semiconductor chip mounted on the first portion of the first chip mounting part, and having a first power transistor;
a second semiconductor chip mounted on the second chip mounting part, and having a second power transistor;
a third semiconductor chip mounted on the second portion of the first chip mounting part, and having a third power transistor;
a fourth semiconductor chip mounted on the third chip mounting part, and having a fourth power transistor;
a first lead;
a second lead formed integrally with the second portion of the first chip mounting part;
a third lead;
a fourth lead formed integrally with the first portion of the first chip mounting part; and
a sealing member sealing the first chip mounting part to the third chip mounting part, the first semiconductor chip to the fourth semiconductor chip, a part of the first lead, a part of the second lead, a part of the third lead, and a part of the fourth lead, the sealing member including an upper surface, a lower surface positioned on an opposite side of the upper surface, a first side surface positioned between the upper surface and the lower surface in a thickness direction, and a second side surface facing the first side surface,
wherein the first chip mounting part to the third chip mounting part are arranged along a first direction in which the first side surface of the sealing member extends,
wherein the second chip mounting part is arranged between the first portion of the first chip mounting part and the second portion of the first chip mounting part when seen in a plan view,
wherein the second portion of the first chip mounting part is arranged between the second chip mounting part and the third chip mounting part when seen in a plan view,
wherein each of the first lead, the second lead, the third lead and the fourth lead includes a protruding portion protruding from the first side surface of the sealing member,
wherein the protruding portion of the second lead includes a part capable of being connected to a mounting substrate,
wherein a first rear surface electrode of the first semiconductor chip and a third rear surface electrode of the third semiconductor chip are electrically connected with each other via the first chip mounting part,
wherein a second rear surface electrode of the second semiconductor chip is electrically connected with the second chip mounting part,
wherein a fourth rear surface electrode of the fourth semiconductor chip is electrically connected with the third chip mounting part,
wherein a first front surface electrode of the first semiconductor chip and the second chip mounting part are electrically connected with each other via a first conductive member,
wherein a second front surface electrode of the second semiconductor chip and the first lead are electrically connected with each other via a second conductive member,
wherein a third front surface electrode of the third semiconductor chip and the third chip mounting part are electrically connected with each other via a third conductive member, and
wherein a fourth front surface electrode of the fourth semiconductor chip and the third lead are electrically connected with each other via a fourth conductive member.

2. The semiconductor device according to claim 1,
wherein the part capable of being connected to the mounting substrate is a part capable of being soldered with the mounting substrate.

3. The semiconductor device according to claim 1,
wherein the part capable of being connected to the mounting substrate is a part capable of being inserted into the mounting substrate.

4. The semiconductor device according to claim 1,
wherein a length of the protruding portion of the first lead, a length of the protruding portion of the second lead, and a length of the protruding portion of the third lead are equal to each other.

5. The semiconductor device according to claim 1,
wherein a heat capacity of the protruding portion of the second lead is larger than a heat capacity of the protruding portion of the first lead.

6. The semiconductor device according to claim 5,
wherein the protruding portion of the second lead has a first protruding portion and a second protruding portion which are spaced apart from each other.

7. The semiconductor device according to claim 6,
wherein a width of the first protruding portion in the first direction and a width of the second protruding portion in the first direction are equal to each other.

8. The semiconductor device according to claim 6,
wherein the first protruding portion of the second lead is arranged between the first lead and the second protruding portion of the second lead when seen in a plan view.

9. The semiconductor device according to claim 8,
wherein an interval in the first direction between the first lead and the first protruding portion of the second lead is equal to an interval in the first direction between the first protruding portion of the second lead and the second protruding portion of the second lead.

10. The semiconductor device according to claim 6,
wherein a part capable of being soldered with the mounting substrate is formed in the first protruding portion, and
wherein a part capable of being inserted into the mounting substrate is formed in the second protruding portion.

11. The semiconductor device according to claim 5,
wherein a width of the protruding portion of the second lead in the first direction is larger than a width of the protruding portion of the first lead in the first direction.

12. The semiconductor device according to claim 1,
wherein the first semiconductor chip is mounted on a rear surface of the first portion of the first chip mounting part,
wherein the second semiconductor chip is mounted on a rear surface of the second chip mounting part,
wherein the third semiconductor chip is mounted on a rear surface of the second portion of the first chip mounting part, and
wherein the fourth semiconductor chip is mounted on a rear surface of the third chip mounting part.

13. The semiconductor device according to claim 1, further comprising:
a control unit controlling the first power transistor to the fourth power transistor; and
a plurality of control leads electrically connected with the control unit,
wherein each of the plurality of control leads protrudes from the second side surface of the sealing member.

14. The semiconductor device according to claim 1,
wherein each of the first power transistor to the fourth power transistor is an insulated gate bipolar transistor,
wherein each of the first rear surface electrode to the fourth rear surface electrode functions as a collector, and
wherein each of the first front surface electrode to the fourth front surface electrode functions as an emitter.

15. The semiconductor device according to claim 1,
wherein each of the first power transistor to the fourth power transistor is a field effect transistor,
wherein each of the first rear surface electrode to the fourth rear surface electrode functions as a drain, and
wherein each of the first front surface electrode to the fourth front surface electrode functions as a source.

16. The semiconductor device according to claim 1,
wherein the first portion is integrally formed with the second portion of the first chip mounting part.

17. The semiconductor device according to claim 1,
wherein the first mounting part includes a third portion and a fifth lead is integrally formed with the third portion;
wherein the sealing member seals a part of the fifth lead; and
wherein the fifth lead includes a protruding portion protruding from the first side surface of the sealing member.

18. The semiconductor device according to claim 17,
wherein the third portion is integrally formed with the first and second portions of the first mounting part.

* * * * *